United States Patent
Smith

(10) Patent No.: US 7,460,661 B2
(45) Date of Patent: Dec. 2, 2008

(54) METHOD AND MEANS FOR INCREASING INHERENT CHANNEL CAPACITY FOR WIRED NETWORK

(75) Inventor: Harry B. Smith, Baltimore, MD (US)

(73) Assignee: Apex/Eclipse Systems, Inc., Baltimore, MD (US)

(*) Notice: Subject to any disclaimer, the term of this patent is extended or adjusted under 35 U.S.C. 154(b) by 1139 days.

(21) Appl. No.: 10/793,251

(22) Filed: Mar. 5, 2004

(65) Prior Publication Data

US 2004/0240662 A1 Dec. 2, 2004

Related U.S. Application Data

(62) Division of application No. 09/665,658, filed on Sep. 20, 2000, now Pat. No. 7,106,853.

(60) Provisional application No. 60/154,781, filed on Sep. 20, 1999.

(51) Int. Cl.
H04M 1/00 (2006.01)
H04M 9/00 (2006.01)

(52) U.S. Cl. ................................. 379/392.01

(58) Field of Classification Search ............. 379/392.01
See application file for complete search history.

(56) References Cited

U.S. PATENT DOCUMENTS

| | | |
|---|---|---|
| 3,757,335 A | 9/1973 | Gruenberg |
| 4,057,758 A | 11/1977 | Hattori et al. |
| 4,238,746 A | 12/1980 | McCool et al. |
| 4,539,689 A | 9/1985 | Chiu et al. |
| 4,582,192 A | 4/1986 | Rojlar et al. |
| 5,140,702 A | 8/1992 | Laflin |
| 5,203,023 A | 4/1993 | Saito et al. |
| 5,383,164 A | 1/1995 | Sejnowski |
| 5,459,668 A | 10/1995 | Dogan |
| 5,515,378 A | 5/1996 | Roy |
| 5,585,803 A | 12/1996 | Miura et al. |
| 5,694,416 A | 12/1997 | Johnson |
| 5,724,395 A | 3/1998 | Golla et al. |
| 5,757,318 A | 5/1998 | Reudink |
| 5,771,439 A | 6/1998 | Kennedy, Jr. et al. |
| 5,995,499 A | 11/1999 | Hottinen et al. |
| 6,058,318 A | 5/2000 | Kobayakawa et al. |
| 6,081,566 A | 6/2000 | Molnar et al. |

(Continued)

OTHER PUBLICATIONS

Harry Lieb et al., 'Adaptive Lattice Filter for Multiple Sinusoids in White Noise', Jul. 1987, IEEE Transactions on Acoustics, Speech, and Signal Processing, vol. ASSP-35 No. 7, pp. 1015-1020.

Primary Examiner—Alexander Jamal
(74) Attorney, Agent, or Firm—Roylance, Abrams, Berdo & Goodman, L.L.P.

(57) ABSTRACT

A receive system providing enhanced Signal to Noise performance is applicable to a wide variety of applications including both wireless and wireline systems which further include internet type communications. Received signals are converted to digital values and stored in a manner which enables subsequent processing directed to improving the resolution of the received signals and to reduce the associated noise corresponding to the received data samples. The Signal-to-Noise ratio of the received data signals is improved as a result of processing techniques made possible by the digitally stored nature of the received data and a unique iterative data processing method.

4 Claims, 13 Drawing Sheets

U.S. PATENT DOCUMENTS

| | | |
|---|---|---|
| 6,104,935 A | 8/2000 | Smith et al. |
| 6,167,286 A | 12/2000 | Ward et al. |
| 6,185,440 B1 | 2/2001 | Barratt et al. |
| 6,188,915 B1 | 2/2001 | Martin |
| 6,201,955 B1 | 3/2001 | Jasper et al. |
| 6,236,862 B1 | 5/2001 | Erten et al. |
| 6,266,528 B1 | 7/2001 | Farzaneh |
| 6,330,431 B1 | 12/2001 | Rostamy et al. |
| 6,630,431 B2 | 10/2003 | Berglund |
| 6,640,110 B1 | 10/2003 | Shapira et al. |
| 6,658,234 B1 | 12/2003 | Dogan |

2-Wire ("Same" Signal - 2 Noises)
Option 1

1-Wire Sequentially
Option 2

1-Wire Using in Phase I and Quadrature Q
Option 3

| | Mic(A) | -0.9v | -0.85v | -0.80v | -0.75v | -0.70v | -0.65v | -0.60v | -0.55v | -0.50v | -0.45v | -0.40v | -0.35v | -0.30v | -0.25v | -0.20v | -0.15v | -0.1v |
|---|---|---|---|---|---|---|---|---|---|---|---|---|---|---|---|---|---|---|
| Avg 20B | 0.041 | 1.206 / -0.552 | 1.156 / -0.502 | 1.106 / -0.452 | 1.056 / -0.402 | 1.006 / -0.352 | 1.956 / -0.306 | 0.906 / -0.252 | 0.856 / -0.202 | 0.806 / -0.152 | 0.756 / -0.102 | 0.706 / -0.052 | 0.656 / 0.002 | 0.606 / 0.048 | 0.556 / 0.098 | 0.506 / 0.148 | 0.456 / 0.198 | 0.406 / 0.248 |
| Avg 21A | -0.052 | -0.591 / -1.161 | 0.541 / -1.111 | 0.491 / -1.061 | 0.441 / -1.011 | 0.391 / -.961 | 0.341 / -0.911 | 0.291 / -0.861 | 0.241 / -0.811 | 0.191 / -0.761 | 0.141 / -0.711 | 0.091 / -0.661 | 0.041 / -0.611 | 0.009 / -0.561 | 0.059 / -0.511 | 0.109 / -0.461 | -0.159 / -0.411 | -0.209 / -0.361 |
| Avg 22A | 0.060 | 0.735 / -1.005 | 0.685 / -0.935 | 0.635 / -0.905 | 0.585 / -0.855 | 0.535 / -0.805 | 0.485 / -0.755 | 0.435 / -0.705 | 0.385 / -0.655 | 0.335 / -0.605 | 0.285 / -0.555 | 0.235 / -0.505 | 0.185 / -0.455 | 0.135 / -0.405 | 0.085 / -0.355 | 0.035 / -0.305 | -0.015 / -0.255 | -0.065 / -0.205 |
| Avg 23A | 0.023 | 0.654 / -1.124 | 0.604 / -1.074 | 0.554 / -1.024 | 0.504 / -0.974 | 0.454 / -0.924 | 0.404 / -0.874 | 0.354 / -0.824 | 0.304 / -0.774 | 0.254 / -0.724 | 0.204 / -0.674 | 0.154 / -0.624 | 0.104 / -0.574 | 0.054 / -0.524 | 0.004 / -0.474 | -0.046 / -0.424 | -0.096 / -0.374 | 0.146 / -0.324 |
| Avg 24A | -0.002 | 1.166 / -0.637 | 1.116 / -0.587 | 1.066 / -0.537 | 1.016 / -0.487 | 0.966 / -0.437 | 0.916 / -0.387 | 0.866 / -0.337 | 0.816 / -0.287 | 0.766 / -0.237 | 0.716 / -0.187 | 0.666 / -0.137 | 0.616 / -0.087 | 0.566 / -0.037 | 0.516 / 0.013 | 0.466 / 0.063 | 0.416 / 0.113 | 0.366 / 0.163 |
| Avg 25B | -0.032 | 1.100 / -0.732 | 1.050 / -0.682 | 1.000 / -0.632 | 0.950 / -0.582 | 0.900 / -0.532 | 0.850 / -0.482 | 0.800 / -0.432 | 0.750 / -0.382 | 0.700 / -0.332 | 0.650 / -0.282 | 0.600 / -0.232 | 0.550 / -0.182 | 0.500 / -0.132 | 0.450 / -0.082 | 0.400 / -0.032 | 0.350 / 0.018 | 0.250 / 0.068 |
| Avg 26B | 0.163 | 0.487 / -1.481 | 0.432 / -1.431 | 0.387 / -1.381 | 0.337 / -1.331 | 0.287 / -1.281 | 0.237 / -1.231 | 0.187 / -1.181 | 0.137 / -1.131 | 0.087 / -1.081 | 0.037 / 0.031 | 0.013 / -0.981 | -0.063 / -0.931 | -0.113 / -0.881 | -0.163 / -0.831 | -0.213 / -0.781 | -0.263 / -0.731 | -0.313 / -0.681 |
| Avg 27A | 0.120 | 0.924 / -0.756 | 0.874 / -0.706 | 0.824 / -0.656 | 0.774 / -0.706 | 0.724 / -0.556 | 0.674 / -0.506 | 0.624 / -0.456 | 0.574 / -0.406 | 0.524 / -0.356 | 0.474 / -0.306 | 0.424 / -0.256 | 0.374 / -0.206 | 0.324 / -0.156 | 0.274 / -0.106 | 0.224 / -0.056 | 0.174 / -0.006 | 0.124 / 0.044 |
| Avg 28C | 0.178 | 0.782 / -0.840 | 0.732 / -0.790 | 0.682 / -0.740 | 0.632 / -0.690 | 0.582 / -0.640 | 0.532 / -0.590 | 0.482 / -0.540 | 0.432 / -0.490 | 0.382 / -0.440 | 0.332 / -0.380 | 0.282 / -0.340 | 0.232 / -0290 | 0.182 / -0.240 | 0.132 / -0.190 | 0.082 / -0.140 | 0.032 / -0.090 | -0.018 / -0.040 |
| Avg 29C | 0.128 | 1.246 / -0.683 | 1.196 / -0.633 | 1.146 / -0.583 | 1.096 / -0.533 | 1.046 / -0.483 | 0.996 / -0.433 | 0.946 / -0.383 | 0.896 / -0.333 | 0.846 / -0.283 | 0.796 / -0.233 | 0.746 / -0.183 | 0.696 / -0.133 | 0.646 / -0.063 | 0.596 / -0.033 | 0.546 / -0.017 | 0.496 / 0.067 | 0.446 / 0.117 |
| Avg 30B | 0.032 | 0.848 / -0.921 | 0.798 / -0.871 | 0.748 / -0.821 | 0.698 / -0.771 | 0.648 / -0.721 | 0.598 / -0.671 | 0.548 / -0.621 | 0.498 / -0.571 | 0.446 / -0.521 | 0.398 / -0.471 | 0.348 / -0.421 | 0.298 / -0.371 | 0.248 / -0.321 | 0.198 / -0.271 | 0.148 / -0.221 | 0.098 / -0.171 | 0.049 / -0.121 |
| Avg 31C | 0.178 | 0.786 / -1.187 | 0.736 / -1.137 | 0.686 / -1.087 | 0.636 / -0.037 | 0.586 / -0.987 | 0.536 / -0.937 | 0.486 / -0.887 | 0.436 / -0.837 | 0.386 / -0.787 | 0.336 / -0.737 | 0.286 / -0.687 | 0.236 / -0.637 | 0.186 / -0.587 | 0.136 / -0.537 | 0.086 / -0.487 | 0.036 / -0.437 | 0.014 / -0.387 |
| Avg 32C | -0.015 | 1.060 / -0.755 | 1.010 / -0.705 | 0.960 / -0.655 | 0.910 / -0.605 | 0.860 / -0.555 | 0.810 / -0.505 | 0.760 / -0.455 | 0.710 / -0.405 | 0.660 / -0.355 | 0.610 / -0.305 | 0.560 / -0.255 | 0.510 / -0.205 | 0.460 / -0.155 | 0.410 / -0.105 | 0.360 / -0.055 | 0.310 / -0.005 | 0.260 / 0.045 |
| Avg 33C | -0.050 | 0.993 / -0.887 | 0.943 / -0.837 | 0.893 / -0.787 | 0.843 / -0.737 | 0.793 / -0.687 | 0.743 / -0.637 | 0.693 / -0.587 | 0.643 / -0.537 | 0.593 / -0.487 | 0.543 / -0.437 | 0.493 / -0.387 | 0.443 / -0.337 | 0.393 / -0.287 | 0.343 / -0.237 | 0.333 / -0.187 | 0.243 / -0.137 | 0.193 / -0.087 |
| Avg 34A | 0.203 | 0.530 / -1.479 | 0.480 / -1.429 | 0.430 / -1.379 | 0.380 / -1.329 | 0.330 / -1.279 | 0.280 / -1.229 | 0.230 / -1.179 | 0.180 / -1.129 | 0.130 / -1.079 | 0.080 / -1.029 | 0.030 / -0.979 | -0.020 / -0.929 | -0.070 / -0.879 | -0.120 / -0.829 | -0.170 / -0.779 | -0.220 / -0.729 | -0.270 / -0.679 |
| Avg 35C | -0.083 | 1.035 / -0.848 | 0.985 / -0.798 | 0.935 / -0.748 | 0.885 / -0.698 | 0.835 / -0.648 | 0.785 / -0.598 | 0.735 / -0.448 | 0.685 / -0.498 | 0.635 / -0.448 | 0.585 / -0.398 | 0.435 / -0.348 | 0.485 / 0.298 | 0.435 / -0.248 | 0.385 / -0.198 | 0.335 / -0.148 | 0.285 / -0.098 | 0.235 / -0.048 |
| Avg 36B | 0.213 | 1.171 / -0.841 | 1.121 / -0.791 | 1.071 / -0.741 | 1.021 / -0.691 | 0.971 / -0.641 | 0.921 / -0.591 | 0.871 / -0.541 | 0.821 / -0.491 | 0.771 / -0.441 | 0.721 / -0.391 | 0.671 / -0.341 | 0.621 / -0.291 | 0.571 / -0.241 | 0.521 / -0.191 | 0.471 / -0.141 | 0.421 / -0.091 | 0.371 / -0.041 |
| Avg 37C | 0.015 | 1.024 / -0.761 | 0.974 / -0.711 | 0.824 / -0.661 | 0.874 / -0.611 | 0.824 / -0.561 | 0.774 / -0.511 | 0.724 / -0.461 | 0.674 / -0.411 | 0.624 / -0.361 | 0.574 / -0.311 | 0.423 / -0.261 | 0.474 / -0.211 | 0.424 / -0.161 | 0.374 / -0.111 | 0.324 / -0.061 | 0.274 / -0.011 | 0.224 / 0.039 |
| Avg 38B | 0.003 | 0.616 / -1.181 | 0.566 / -1.131 | 0.516 / -1.081 | 0.466 / -1.031 | 0.416 / -0.981 | 0.366 / -0.931 | 0.316 / -0.881 | 0.266 / -0.831 | 0.216 / -0.781 | 0.166 / -0.731 | 0.116 / -0.687 | 0.066 / -0.631 | 0.016 / -0.581 | -0.034 / -0.531 | -0.084 / -0.481 | -0.134 / -0.431 | -0.184 / -0.381 |

FIG. 4A

| -0.05V | 0.00V | 0.05V | 0.10V | 0.15V | 0.20V | 0.25V | 0.30V | 0.35V | 0.40V | 0.45V | 0.50V | 0.55V | 0.60V | 0.65V | 0.70V | 0.75V |
|---|---|---|---|---|---|---|---|---|---|---|---|---|---|---|---|---|
| 0.356 | 0.306 | 0.256 | 0.206 | 0.156 | 0.106 | 0.056 | 0.006 | -0.044 | -0.094 | -0.144 | -0.194 | -0.244 | -0.294 | -0.344 | -0.394 | -0.444 |
| 0.298 | 0.348 | 0.398 | 0.448 | 0.498 | 0.548 | 0.598 | 0.648 | 0.698 | 0.748 | 0.798 | 0.848 | 0.898 | 0.948 | 0.998 | 1.048 | 1.098 |
| -0.159 | -0.209 | -0.259 | -0.309 | -0.359 | -0.409 | -0.459 | -0.509 | -0.559 | 0.609 | -0.659 | -0.709 | -0.759 | -0.809 | -0.859 | -0.909 | -0.959 |
| -0.311 | -0.261 | -0.211 | -0.161 | -0.111 | -0.061 | -0.011 | 0.039 | 0.089 | 0.139 | 0.189 | 0.239 | 0.289 | 0.339 | 0.389 | 0.439 | 0.489 |
| -0.115 | -0.165 | -0.215 | -0.265 | -0.315 | -0.365 | -0.415 | -0.465 | -0.515 | -0.565 | -0.615 | -0.665 | -0.715 | -0.765 | -0.815 | -0.865 | -0.915 |
| -0.155 | -0.105 | -0.055 | 0.005 | 0.045 | 0.095 | 0.145 | 0.195 | 0.245 | 0.295 | 0.345 | 0.395 | 0.445 | 0.495 | 0.545 | 0.595 | 0.645 |
| -0.196 | -0.246 | -0.296 | -0.346 | -0.396 | -0.446 | -0.496 | -0.546 | -0.596 | -0.646 | -0.696 | -0.746 | -0.796 | -0.846 | -0.896 | -0.946 | -0.996 |
| -0.274 | -0.224 | -0.174 | -0.124 | -0.074 | -0.024 | 0.026 | 0.076 | 0.126 | 0.176 | 0.226 | 0.276 | 0.326 | 0.376 | 0.426 | 0.476 | 0.526 |
| 0.316 | 0.266 | 0.216 | 0.166 | 0.116 | 0.066 | 0.016 | -0.034 | -0.084 | -0.134 | -0.184 | -0.234 | -0.284 | -0.334 | -0.384 | -0.434 | -0.484 |
| 0.213 | 0.263 | 0.313 | 0.363 | 0.413 | 0.463 | 0.513 | 0.563 | 0.613 | 0.663 | 0.713 | 0.763 | 0.813 | 0.863 | 0.913 | 0.963 | 1.013 |
| 0.250 | 0.200 | 0.150 | 0.100 | 0.050 | 0.000 | -0.050 | -0.100 | -0.150 | -0.200 | -0.250 | -0.300 | -0.350 | -0.400 | -0.450 | -0.500 | -0.550 |
| 0.118 | 0.165 | 0.218 | 0.265 | 0.318 | 0.368 | 0.418 | 0.468 | 0.518 | 0.568 | 0.618 | 0.668 | 0.718 | 0.768 | 0.818 | 0.868 | 0.918 |
| -0.363 | -0.413 | -0.463 | -0.513 | -0.563 | -0.613 | -0.663 | -0.713 | -0.763 | -0.813 | -0.863 | -0.913 | -0.963 | -1.013 | -1.063 | -1.113 | -1.163 |
| -0.631 | -0.581 | -0.531 | -0.481 | -0.431 | -0.381 | -0.331 | -0.281 | -0.231 | -0.181 | -0.131 | -0.081 | -0.031 | 0.019 | 0.069 | 0.119 | 0.169 |
| 0.074 | 0.024 | -0.026 | -0.076 | -0.126 | -0.176 | -0.226 | -0.276 | -0.326 | -0.376 | -0.426 | -0.476 | -0.526 | -0.576 | -0.626 | -0.676 | -0.726 |
| 0.094 | 0.144 | 0.184 | 0.244 | 0.284 | 0.344 | 0.384 | 0.444 | 0.484 | 0.544 | 0.584 | 0.644 | 0.684 | 0.744 | 0.784 | 0.844 | 0.884 |
| -0.068 | -0.118 | -0.168 | -0.218 | -0.268 | -0.318 | -0.368 | -0.418 | -0.468 | -0.518 | -0.568 | -0.618 | -0.668 | -0.718 | -0.768 | -0.818 | -0.868 |
| 0.010 | 0.060 | 0.110 | 0.160 | 0.210 | 0.260 | 0.310 | 0.360 | 0.410 | 0.460 | 0.510 | 0.560 | 0.610 | 0.660 | 0.710 | 0.760 | 0.810 |
| 0.396 | 0.346 | 0.296 | 0.246 | 0.196 | 0.146 | 0.096 | 0.046 | 0.004 | -0.054 | -0.104 | -0.154 | -0.204 | -0.254 | -0.304 | -0.354 | -0.404 |
| 0.167 | 0.217 | 0.267 | 0.317 | 0.367 | 0.417 | 0.467 | 0.517 | 0.567 | 0.617 | 0.667 | 0.717 | 0.767 | 0.817 | 0.867 | 0.917 | 0.964 |
| 0.002 | -0.052 | -0.102 | -0.152 | -0.202 | -0.252 | -0.302 | -0.352 | -0.402 | -0.452 | -0.502 | -0.552 | -0.602 | -0.652 | -0.702 | -0.752 | -0.802 |
| -0.071 | -0.021 | 0.029 | 0.079 | 0.129 | 0.179 | 0.229 | 0.279 | 0.329 | 0.379 | 0.429 | 0.479 | 0.529 | 0.579 | 0.629 | 0.679 | 0.729 |
| -0.064 | -0.114 | -0.164 | -0.214 | -0.264 | -0.314 | -0.364 | -0.414 | -0.464 | -0.514 | -0.564 | -0.614 | -0.664 | -0.714 | -0.764 | -0.814 | -0.864 |
| -0.337 | -0.287 | -0.237 | -0.187 | -0.137 | -0.087 | -0.037 | 0.013 | 0.063 | 0.113 | 0.163 | 0.213 | 0.263 | 0.313 | 0.363 | 0.413 | 0.463 |
| 0.210 | 0.160 | 0.110 | 0.060 | 0.010 | -0.040 | -0.090 | -0.140 | -0.190 | -0.240 | -0.290 | -0.340 | -0.390 | -0.440 | -0.490 | -0.540 | -0.590 |
| 0.095 | 0.145 | 0.195 | 0.245 | 0.295 | 0.345 | 0.395 | 0.445 | 0.495 | 0.545 | 0.595 | 0.645 | 0.695 | 0.745 | 0.795 | 0.845 | 0.895 |
| 0.143 | 0.093 | 0.043 | 0.007 | -0.057 | -0.107 | -0.157 | -0.207 | -0.257 | -0.307 | -0.357 | -0.407 | -0.457 | -0.507 | -0.557 | -0.607 | -0.657 |
| -0.037 | 0.013 | 0.063 | 0.113 | 0.163 | 0.213 | 0.263 | 0.313 | 0.363 | 0.413 | 0.463 | 0.513 | 0.563 | 0.613 | 0.663 | 0.713 | 0.763 |
| -0.320 | -0.370 | -0.420 | -0.470 | -0.520 | -0.570 | -0.620 | -0.670 | -0.720 | -0.770 | -0.820 | -0.870 | -0.920 | -0.970 | -1.020 | -1.070 | -1.120 |
| -0.629 | -0.579 | -0.529 | -0.479 | -0.429 | -0.379 | -0.329 | -0.279 | -0.229 | -0.179 | -0.129 | -0.079 | -0.029 | 0.021 | 0.071 | 0.121 | 0.171 |
| 0.185 | 0.135 | 0.085 | 0.035 | -0.015 | -0.065 | -0.115 | -0.165 | -0.215 | -0.265 | -0.315 | -0.365 | -0.415 | -0.465 | -0.515 | -0.565 | -0.615 |
| 0.002 | 0.052 | 0.102 | 0.152 | 0.202 | 0.252 | 0.302 | 0.352 | 0.402 | 0.452 | 0.502 | 0.552 | 0.602 | 0.652 | 0.702 | 0.752 | 0.802 |
| 0.321 | 0.271 | 0.221 | 0.171 | 0.121 | 0.071 | 0.021 | -0.029 | -0.079 | -0.129 | -0.179 | -0.229 | -0.279 | -0.329 | -0.379 | -0.429 | -0.479 |
| 0.009 | 0.059 | 0.109 | 0.159 | 0.209 | 0.259 | 0.309 | 0.359 | 0.409 | 0.459 | 0.509 | 0.559 | 0.609 | 0.659 | 0.709 | 0.759 | 0.809 |
| 0.174 | 0.124 | 0.074 | 0.024 | -0.026 | -0.076 | -0.126 | -0.176 | -0.226 | -0.276 | -0.326 | -0.376 | -0.426 | -0.476 | -0.526 | -0.576 | -0.626 |
| 0.089 | 0.139 | 0.189 | 0.239 | 0.289 | 0.339 | 0.389 | 0.439 | 0.489 | 0.539 | 0.589 | 0.639 | 0.689 | 0.739 | 0.789 | 0.839 | 0.889 |
| -0.234 | -0.284 | -0.334 | -0.384 | -0.434 | -0.484 | -0.534 | -0.584 | -0.634 | -0.684 | -0.734 | -0.784 | -0.834 | -0.884 | -0.934 | -0.984 | -1.034 |
| -0.331 | -0.281 | -0.231 | -0.181 | -0.131 | -0.081 | -0.031 | 0.019 | 0.069 | 0.119 | 0.169 | 0.219 | 0.269 | 0.319 | 0.369 | 0.419 | 0.469 |

FIG. 4B

Regular & Reverse Scans

Column Location

| | Mic(A) | -0.9v | -0.85v | -0.80v | -0.75v | -0.70v | -0.65v | -0.60v | -0.55v | -0.50v | -0.45v | -0.40v | -0.35v | -0.30v | -0.25v | -0.20v | -0.15v | -0.1v |
|---|---|---|---|---|---|---|---|---|---|---|---|---|---|---|---|---|---|---|
| Avg 20B | 0.041 | 2.431 0.672 | 2.381 0.922 | 3.231 0.772 | 2.381 0.829 | 2.231 0.572 | 2.181 0.922 | 2.131 0.972 | 2.081 1.022 | 2.031 1.022 | 1.981 1.123 | 1.931 1.172 | 1.881 1.222 | 1.831 1.272 | 1.781 1.322 | 1.731 1.372 | 1.681 1.422 | 1.531 1.472 |
| Avg 21A | -0.052 | 1.916 0.064 | 1.866 0.114 | 1.816 0.164 | 1.766 0.214 | 1.716 0.264 | 1.666 0.014 | -1.616 0.364 | 1.566 0.414 | 1.516 0.464 | 1.466 0.516 | 1.416 0.564 | 1.366 0.614 | 1.316 0.664 | 1.265 0.716 | 1.216 0.764 | 1.166 0.816 | 1.116 0.864 |
| Avg 22A | 0.060 | 1.960 0.220 | 1.910 0.270 | 1.860 0.320 | 1.810 0.370 | 1.760 0.420 | 1.710 0.470 | 1.660 0.520 | 1.610 0.570 | 1.560 0.620 | 1.510 0.670 | 1.460 0.720 | 1.410 0.770 | 1.360 0.820 | 1.310 0.870 | 1.260 0.920 | 1.210 0.970 | 1.160 1.020 |
| Avg 23A | 0.022 | 1.878 0.101 | 1.828 0.151 | 1.778 0.201 | 1.728 0.251 | 1.678 0.301 | 1.628 0.351 | 1.578 0.401 | 1.526 0.451 | 1.478 0.501 | 1.428 0.551 | 1.378 0.601 | 1.328 0.651 | 1.278 0.701 | 1.228 0.751 | 1.178 0.801 | 1.128 0.861 | 1.078 0.901 |
| Avg 24A | -0.002 | 2.390 0.588 | 2.360 0.638 | 3.290 0.688 | 2.340 0.738 | 2.190 0.789 | 2.140 0.838 | 2.030 0.888 | 2.040 0.938 | 1.990 0.999 | 1.940 1.038 | 1.870 1.088 | 1.840 1.138 | 1.780 1.188 | 1.740 1.238 | 1.690 1.298 | 1.640 1.238 | 1.690 1.388 |
| Avg 25B | -0.032 | 2.325 0.493 | 2.275 0.543 | 2.225 0.593 | 2.175 -0.663 | 2.125 0.693 | 2.075 0.763 | 2.025 0.793 | 1.975 0.863 | 1.925 0.883 | 1.875 0.963 | 1.825 0.993 | 1.775 1.043 | 1.725 1.093 | 1.675 1.163 | 1.625 1.193 | 1.575 1.243 | 1.525 1.293 |
| Avg 26B | -0.169 | 1.712 0.257 | 1.662 -0.207 | 1.612 -0.157 | 1.562 -0.107 | 1.512 -0.057 | 1.162 -0.007 | 1.412 0.043 | 1.362 0.093 | 1.312 0.143 | 1.262 0.193 | 1.212 0.243 | 1.162 0.293 | 1.112 0.343 | 1.062 0.393 | 1.012 0.443 | 0.863 0.493 | 0.912 0.543 |
| Avg 27A | 0.120 | 2.168 0.468 | 2.033 0.518 | 2.068 0.568 | 1.333 0.618 | 1.963 0.668 | 1.873 0.748 | 1.843 0.768 | 1.739 0.818 | 1.743 0.868 | 1.677 0.918 | 1.647 0.968 | 1.593 1.018 | 1.548 1.068 | 1.493 1.118 | 1.418 1.168 | 1.399 1.218 | 1.319 1.268 |
| Avg 28C | 0.178 | 2.002 0.385 | 1.957 0.435 | 1.907 0.485 | 1.857 0.535 | 1.807 0.595 | 1.757 0.635 | 1.707 0.685 | 1.657 0.735 | 1.607 0.785 | 1.557 0.835 | 1.507 0.885 | 1.457 0.935 | 1.407 0.985 | 1.357 1.035 | 1.307 1.085 | 1.257 1.135 | 1.207 1.185 |
| Avg 29C | -0.129 | 2.471 0.542 | 2.421 0.592 | 2.371 0.642 | 2.321 0.692 | 2.271 0.742 | 2.221 0.792 | 2.171 0.842 | 2.121 0.892 | 2.071 0.942 | 2.021 0.992 | 1.971 1.042 | 1.921 1.092 | 1.871 1.142 | 1.821 1.192 | 1.771 1.242 | 1.721 1.292 | 1.671 1.342 |
| Avg 30B | 0.032 | 2.073 0.304 | 2.023 0.354 | 1.973 0.404 | 1.923 0.454 | 1.873 0.504 | 1.823 0.554 | 1.773 0.604 | 1.723 0.554 | 1.673 0.704 | 1.623 0.754 | 1.573 0.800 | 1.523 0.854 | 1.673 0.904 | 1.423 0.954 | 1.373 1.004 | 1.323 1.054 | 1.273 1.104 |
| Avg 31C | -0.174 | 2.011 0.037 | 1.961 0.087 | 1.811 0.137 | 1.861 0.187 | 1.811 0.237 | 1.761 0.287 | 1.711 0.337 | 1.661 0.387 | 1.611 0.437 | 1.561 0.497 | 1.511 0.537 | 1.461 0.587 | 1.411 0.637 | 1.361 0.687 | 1.311 0.737 | 1.261 0.787 | 1.211 0.837 |
| Avg 32C | -0.015 | 2.285 0.470 | 2.235 0.520 | 2.185 0.570 | 3.135 0.620 | 2.085 0.670 | 2.035 0.720 | 1.985 0.770 | 1.935 0.820 | 1.885 0.870 | 1.835 0.820 | 1.785 0.970 | 1.735 1.020 | 1.685 1.070 | 1.635 1.120 | 1.585 1.170 | 1.535 1.220 | 1.485 1.270 |
| Avg 33C | -0.080 | 2.218 0.338 | 2.168 0.388 | 2.118 0.438 | 2.068 0.188 | 2.018 0.538 | 1.868 0.588 | 1.818 0.638 | 1.868 0.688 | 1.818 0.738 | 1.768 0.788 | 1.718 0.838 | 1.668 0.888 | 1.618 0.338 | 1.568 0.998 | 1.518 1.038 | 1.468 1.088 | 1.418 1.138 |
| Avg 34A | -0.209 | 1.755 -0.255 | 1.705 -0.205 | 1.655 -0.155 | 1.605 -0.105 | 1.555 -0.055 | 1.505 -0.005 | 1.455 0.045 | 1.405 0.095 | 1.355 0.145 | 1.305 0.195 | 1.255 0.245 | 1.205 0.295 | 1.155 0.345 | 1.105 0.395 | 1.055 0.445 | 1.005 0.495 | 0.955 0.545 |
| Avg 35C | -0.083 | 2.260 0.377 | 2.210 0.427 | 2.160 0.477 | 2.110 0.527 | 2.060 0.577 | 2.010 0.627 | 1.960 0.677 | 1.910 0.727 | 1.860 0.777 | 1.810 0.827 | 1.760 0.877 | 1.710 0.927 | 1.660 0.977 | 1.610 1.027 | 1.660 1.077 | 1.510 1.127 | 1.460 1.177 |
| Avg 36B | -0.252 | 2.396 0.384 | 2.366 0.435 | 2.226 0.484 | 2.246 0.534 | 2.196 0.584 | 2.146 0.634 | 2.096 0.684 | 2.046 0.734 | 1.936 0.786 | 1.966 0.834 | 1.836 0.894 | 1.646 0.934 | 1.396 0.994 | 1.746 1.034 | 1.696 1.084 | 1.646 1.134 | 1.596 1.184 |
| Avg 37C | 0.015 | 2.249 0.463 | 2.199 0.519 | 2.149 0.563 | 2.099 0.613 | 2.049 0.663 | 1.999 0.713 | 1.943 0.763 | 1.899 0.813 | 1.843 0.863 | 1.739 0.913 | 1.749 0.963 | 1.699 1.013 | 1.669 1.063 | 1.599 1.113 | 1.549 1.163 | 1.499 1.213 | 1.449 1.263 |
| Avg 38B | 0.003 | 1.841 0.044 | 1.791 0.094 | 1.714 0.144 | 1.691 0.194 | 1.661 0.344 | 1.531 0.394 | 1.545 0.344 | 1.491 0.394 | 1.441 0.444 | 1.321 0.494 | 1.341 0.544 | 1.291 0.594 | 1.241 0.444 | 1.191 0.694 | 1.141 0.244 | 1.091 0.794 | 1.041 0.844 |

FIG. 6

RANDOM Q data

| Trial Group | Orig Noise Avg | New Noise Average | | | | | Equiv Voltage Added | Last Noise Avg | Ratio Orig Last |
|---|---|---|---|---|---|---|---|---|---|
| | | 1 | 2 | 3 | 4 | 5 | | | |
| 205 1 | 0.4440 | 0.3970 | 0.1470 | -0.1030 | 0.0220 | -0.0405 | -0.4532 | -0.0092 | 48.1 |
| 205 2 | 0.1928 | 0.0077 | -0.2423 | 0.0087 | -0.1173 | -0.0548 | -0.2163 | -0.0235 | 8.2 |
| 205 3 | 0.2307 | 0.0107 | -0.2198 | 0.0507 | -0.0943 | -0.0318 | -0.2313 | -0.0006 | 382.9 |
| 206 1 | 0.6667 | 0.6649 | 0.3149 | 0.0619 | -0.0601 | 0.0024 | -0.5355 | -0.0289 | 23.1 |
| 206 2 | -0.0969 | 0.1153 | -0.1347 | 0.1158 | -0.0097 | 0.0528 | 0.1174 | 0.0215 | 4.5 |
| 206 3 | 0.0218 | -0.2565 | -0.0065 | 0.2435 | 0.1185 | 0.0060 | 0.0030 | 0.0248 | 0.9 |
| 207 1 | 0.7412 | 0.7198 | 0.4694 | 0.2194 | 0.0944 | 0.0319 | -0.7406 | 0.0006 | 1181.1 |
| 207 2 | -0.2973 | -0.2622 | -0.0022 | 0.2478 | 0.1228 | 0.0603 | 0.3263 | 0.0290 | 10.2 |
| 207 3 | 0.3031 | -0.0517 | 0.1983 | -0.0517 | 0.0733 | 0.0108 | -0.4036 | -0.0205 | 18.7 |
| 208 1 | 0.2199 | 0.1728 | -0.0772 | 0.1229 | 0.0478 | -0.0147 | -0.2033 | 0.0166 | 13.3 |
| 208 2 | 0.4198 | 0.3966 | 0.1466 | -0.1034 | 0.0216 | -0.0409 | -0.4295 | -0.0097 | 43.4 |
| 208 3 | -0.1523 | -0.0900 | 0.1600 | -0.0900 | 0.0350 | -0.0275 | 0.1561 | 0.0038 | 40.1 |
| 209 1 | -0.3033 | -0.2685 | -0.0185 | 0.2315 | 0.1065 | 0.0440 | 0.3161 | 0.0187 | 23.8 |
| 209 2 | -0.0802 | 0.0528 | -0.1972 | 0.0528 | -0.0722 | -0.0097 | 0.1024 | 0.0216 | 3.7 |
| 209 3 | -0.0148 | 0.1385 | -0.1115 | 0.1385 | 0.0135 | -0.0490 | -0.0029 | -0.0177 | 0.8 |
| 210 1 | 0.2507 | 0.1607 | -0.0693 | 0.1607 | 0.0357 | -0.0268 | -0.2462 | 0.0044 | 56.8 |
| 210 2 | 0.2427 | 0.2049 | -0.0451 | 0.2049 | 0.0799 | 0.0174 | -0.2666 | -0.0139 | 17.5 |
| 210 3 | 0.0961 | -0.0761 | 0.1739 | -0.0741 | 0.0689 | -0.0136 | -0.0784 | 0.0177 | 5.4 |
| 211 1 | 0.8869 | 0.2232 | -0.0268 | 0.2232 | 0.0982 | 0.0357 | -0.2326 | 0.0044 | 53.5 |
| 211 2 | 0.4865 | 0.2534 | 0.0031 | -0.2446 | -0.1816 | -0.0591 | -0.5143 | -0.0278 | 17.5 |
| 211 3 | -0.7412 | -0.7084 | -0.4584 | -0.2039 | -0.0789 | -0.0164 | 0.7660 | 0.0148 | 50.1 |
| 212 1 | 0.5285 | 0.3926 | 0.1426 | -0.1074 | 0.0176 | -0.0449 | -0.5421 | -0.0136 | 38.8 |
| 212 2 | 0.1817 | 0.0830 | -0.1679 | 0.0830 | -0.0420 | 0.0205 | -0.1925 | -0.0107 | 16.9 |
| 212 3 | -0.0208 | 0.1420 | -0.1086 | 0.1420 | 0.0170 | -0.0455 | 0.0056 | -0.0142 | 1.5 |
| 213 1 | -0.2570 | -0.1652 | 0.0848 | -0.1652 | -0.0402 | 0.0223 | 0.2480 | -0.0090 | 28.7 |
| 213 2 | -0.0064 | 0.0310 | -0.2190 | 0.0310 | -0.0940 | -0.0315 | 0.0067 | -0.0003 | 24.3 |
| 213 3 | -0.5096 | -0.3200 | -0.0700 | 0.1800 | 0.0550 | -0.0075 | 0.5333 | 0.0237 | 21.5 |
| 214 1 | -0.0216 | 0.1703 | -0.0295 | 0.1203 | 0.0453 | -0.0172 | 0.0287 | 0.0141 | 1.8 |
| 214 2 | -0.1596 | -0.0912 | 0.1586 | -0.0312 | 0.0338 | -0.0287 | 0.1620 | 0.0025 | 62.8 |
| 214 3 | 0.1216 | -0.0494 | 0.2006 | -0.0494 | 0.0756 | 0.0131 | -0.1398 | -0.0181 | 6.7 |
| 215 1 | -0.3403 | -0.0218 | 0.2287 | -0.0213 | 0.1037 | 0.0412 | 0.3502 | 0.0099 | 34.3 |
| 215 2 | -0.1557 | -0.0243 | 0.2257 | -0.0243 | 0.1007 | 0.0382 | 0.1627 | 0.0069 | 22.4 |
| 215 3 | -0.5943 | -0.3037 | -0.0537 | 0.1963 | 0.0713 | 0.0088 | 0.5718 | -0.0225 | 26.5 |
| 216 1 | 0.1581 | 0.0252 | -0.2218 | 0.0282 | -0.0968 | -0.0343 | -0.1614 | -0.0030 | 52.0 |
| 216 2 | 0.3981 | 0.3294 | 0.1294 | -0.1206 | 0.0044 | -0.0581 | -0.4250 | -0.0268 | 14.0 |
| 216 3 | 0.1159 | -0.0841 | 0.1659 | -0.0841 | 0.0409 | -0.0216 | -0.1063 | 0.0097 | 12.0 |
| 217 1 | 0.4497 | 0.2497 | -0.0003 | 0.2497 | 0.1257 | 0.0522 | -0.4188 | 0.0309 | 14.5 |
| 217 2 | 0.5273 | 0.2169 | -0.0331 | 0.2169 | 0.0919 | 0.0294 | -0.5292 | -0.0019 | 278.7 |
| 217 3 | 0.1066 | -0.0700 | 0.1800 | -0.0700 | 0.0550 | -0.0075 | -0.0829 | 0.0238 | 4.5 |
| 218 1 | -0.4485 | -0.2822 | -0.0322 | 0.2178 | 0.0928 | 0.0303 | 0.4475 | -0.0010 | 453.7 |
| 218 2 | 0.0983 | -0.1467 | 0.1058 | -0.1447 | -0.0197 | 0.0428 | -0.0867 | 0.0115 | 8.5 |
| 218 3 | 0.0171 | -0.1190 | 0.1310 | -0.1190 | 0.0060 | -0.0565 | -0.0423 | -0.0252 | 0.7 |
| 219 1 | 0.0508 | -0.1111 | 0.1389 | -0.1111 | 0.0139 | -0.0485 | -0.0681 | -0.0173 | 2.9 |
| 219 2 | 0.2668 | 0.0668 | -0.1862 | 0.0668 | -0.0582 | 0.0043 | -0.2938 | -0.0270 | 9.9 |
| 219 3 | -0.2172 | -0.1891 | 0.0609 | -0.1891 | -0.0641 | -0.0016 | 0.3088 | 0.0296 | 8.4 |
| 220 1 | 0.6507 | 0.4095 | 0.3595 | 0.1095 | -0.0155 | 0.0470 | -0.6349 | 0.0158 | 41.2 |
| 220 2 | 0.6336 | 0.3617 | 0.1112 | -0.1383 | -0.0144 | 0.0498 | -0.6157 | 0.0179 | 35.4 |
| 220 3 | -0.1340 | 0.1748 | -0.0756 | 0.1748 | 0.0438 | -0.0127 | 0.1565 | 0.0185 | 3.2 |

Original Noise — Result of Each of 1st Five (of Six Iterations) — This Column Yields "Estimate" Noise (Sum of Values Added) — Residual Noise — Voltage Ratio

FIG. 11

METHOD AND MEANS FOR INCREASING INHERENT CHANNEL CAPACITY FOR WIRED NETWORK

CROSS REFERENCE TO RELATED APPLICATIONS

This is a divisional of application Ser. No. 09/665,658 filed Sep. 20, 2000 now U.S. Pat. No. 7,106,853, which claims benefit pursuant to 35 U.S.C. § 119(e)(1) of the filing date of the Provisional Application 60/154,781 filed on Sep. 20, 1999 pursuant to 35 U.S.C. § 111(b); the above noted prior applications are all hereby incorporated by reference.

BACKGROUND OF INVENTION

This invention relates to a unique receiver system which improves the Signal-to-Noise ratio capability of receiving signals, compared to conventional receiver practices, and by processing stored received data in near-real time, reduces the inherent affect of thermal noise. This dramatic improvement in the performance affords greater flexibility with respect to several relevant parameters, such as for example, bandwidth, access time, and multiplex ability and accordingly is beneficial in a wide range of commercial and military markets. The invention is applicable to a variety of wireline telecommunications media and data applications including the "Internet".

There are few communication systems that cannot benefit from a significant reduction in the inherent thermal noise that results from necessary amplification. Previous efforts have been expended to conceive, improve and develop a "wireless" antenna and receiving system that has a dramatically improved signal-to-noise ratio and related characteristics. In this process extensive software programs were conceived and developed for both simulation and solution-to-problem purposes. These techniques have been adapted to wired communication. The result includes means for greatly improving the signal-to-noise ratio that can be obtained from a sequence of digitally converted received signals that are stored and then processed in a wired system suited to the "INTERNET".

The description herein describes the signal-to-noise improvements and involves both "hardware" and "software". These unique features provide the potential for increasing channel capacity and other performance improvements. These opportunities for improvement occur at several links in the operation such as with the service provider(s) and at various "gateways" that receive the communicated modulated signal.

Processing is achieved using modem integrated circuits in an off-line manner that does not adversely compromise the bandwidth of the system. The time for such processing results in a "transport" time delay, which can be made tolerable. The resulting "near real time" performance provides the potential to obtain dramatic S/N improvements beyond that predicted by classic analog developed theory.

Thermal noise is introduced as a result of necessary amplification in the reception of a signal; such noises are usually a limiting factor in the ability to identify a "weak" signal. If such noise is substantially reduced, there results a potential for improving the receptivity of the signal, thereby also allowing for tradeoffs in parameters such as bandwidth and optimization of multiplexing abilities. When transferring packets of digital data, as used in transmitting Internet information, the noise affects the reading in that detecting each "plus" digit so as to be able to distinguish it from the absence of signal which constitutes a "minus" digit. As noise is reduced, weaker digits can be read more reliably and a lower "error rate" results. For a given "acceptable error rate", the improvement in signal-to-noise can be used to increase the number of signals that can be multiplexed and maintain the same error rate and thereby increase the system capacity.

The unique techniques used in the processing are intended to be performed digitally to obtain the desired precision and preserve the numerical accuracy. It is consistent with such processing to convert both the signal and the noise introduced at reception to a digital format. Thus, despite the fact that the packets are already digital, it is more consistent to restore the signal to analog and then convert the analog signal plus noise to digital signal-plus-noise. This, in some respects may be unnecessary because the digital packet that is corrupted by the analog receiver noise probably will reduce to the same digital numbers as the more pedantic approach of converting to all analog and then conversion back to digital. These options are discussed later in connection with block diagrams (FIG. 1 and FIG. 3).

The ability to reduce thermal noise limitations that are inherent in any receiving system, beyond the results obtained by averaging several trials, is unique. Such achievement is facilitated by the digital nature of the process (specifically the "storage" of the digitized numbers). However, "being digital" does not in itself produce S/N improvement. Rather, it is the subsequent use of unique iterative processing using an inherent storage and a matrix that serves as a "change sensor" that has unique properties herein described that causes each step to act as a part of a converging iterative procedure with logic that applies to each of the several iterations.

The improvement over merely averaging the noise is the result of improving the "entropy" of the overall process. The processing steps bring a degree of order not initially present. Such order is the result of forcing each and every sample of the noise in a special numerical array to change polarity in a carefully defined manner. This occurs during successive trials, each of which serves as a row of the stored matrix. From this stored information, inherent in the digital matrix, a unique iterative processor, to be described later, will extract the desired information by off-line processing using the signal plus noise flow shown in FIGS. 8 and 9.

SUMMARY OF THE INVENTION

It is, therefore, an object of the present invention to provide an improved receive system, including an integrated circuit device or group of devices, that provides the ability to distinguish between signals with low power levels thereby substantially increasing the S/N ratio of the system.

A further object of the present invention is to provide a digital processing method, which can be carried out in software and which uses a specially conceived integration of circuit hardware.

A further object of the present invention is to provide a receive system whereby received signals are sampled periodically and the noise component of the overall received signal sample is estimated from each received signal plus noise sample, leaving nearly noiseless samples of the received signal.

A further object of the present invention is to provide a method for near-real-time iterative processing, which is performed offline with respect to stored data using a number of iterative steps.

A further object of the present invention is to provide "polarity change" sensing means, referred to herein as a Topographical Change Sensor (TCS), appropriate for executing the several steps of the noise reducing iterative process.

A further object of the present invention is to provide an iterative sequence programmer that provides, in "near real-time," an appropriate control of value steps, and responses to changes sensed by the TCS.

To achieve the above and other objects of the present invention the following embodiments are provided as examples for the invention. Persons skilled in the art would be aware of techniques available to modify various elements of the invention without straying from the scope and spirit of the invention.

The received signals are amplified and presented to Analog-to-Digital (A/D) converters where digital representations of IN-phase (I) and Quadrature (Q) components of the received signal can be determined. Incidentally, it is in the amplification stage that most of the noise, which comprises the overall system noise, is inherently introduced, as in most receive systems. A phase reference can be established for subsequent processing and the I component, also known as the I-vector can be set to this phase reference while the Q component, or Q-vector can be established 90 degrees out of phase with respect to the reference.

A clock reference for the A/D conversion is synchronized with the phase reference. Each of the I and Q components, thus, contains both signal and noise and may include other unwanted signal as well, in the form of "cross talk".

Further, a multi-step process is performed on the collected data wherein a matrix for each of the I data, as well as the Q data, samples is initially created which includes several samples of signal-plus-noise data. The data is formatted and applied to an iterative process scheme consisting of an "iterative sequence programmer" and a special topographical number array that serves as a "change sensor". Upon completion of the iterative processing, "noise-only" data results, which is the net algebraic sum of the different iterative values. The noise-only data is subtracted from the stored signal-plus-noise samples leaving the signal, with the noise greatly reduced.

The invention thereby provides an improvement to the entropy of a sequence of events that have previously occurred and have been stored.

BRIEF DESCRIPTION OF THE DRAWINGS

The objects and feature of the present invention will become more readily apparent from the following detailed descriptions of the preferred embodiments taken in conjunction with the accompanying drawings in which:

FIGS. 4A and 4B are computer printout illustrations of a method of forcing the noise samples to transition through zero at appropriate points in the number array.

FIG. 6 is a computer simulation printout illustrating topological groupings of signals plus noise in accordance with the present invention.

FIG. 11 is a printout indicating the type of numerical results from the above series of operations.

DETAILED DESCRIPTION OF THE PREFERRED EMBODIMENTS

Figure 1A:
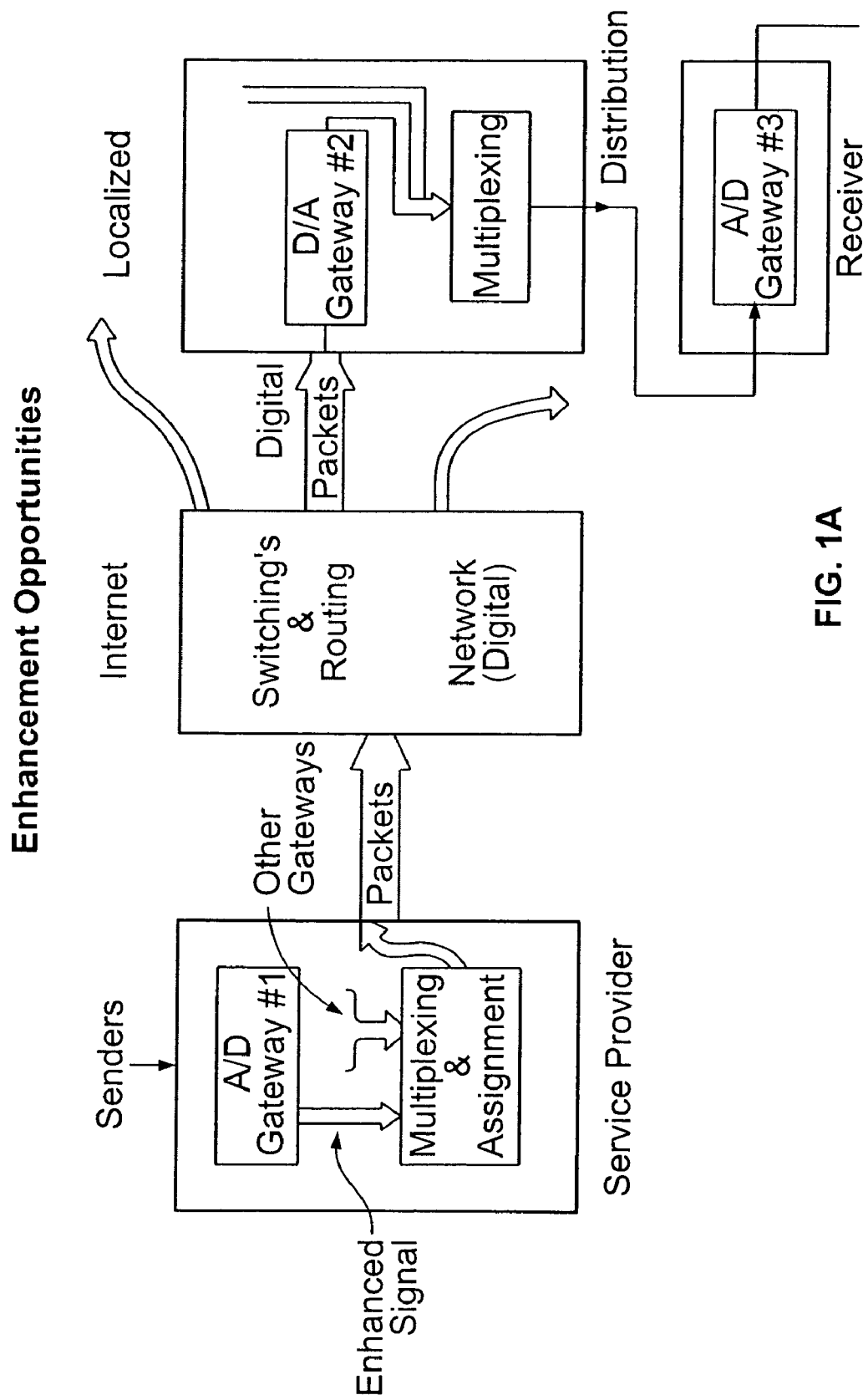
FIGS. 1A, 1B and 1C show typical roles of the invention at different places in the overall information transfer system where the potential improvement is substantial.

Several aspects of the present invention are specifically directed to improving the signal-to-noise of a received signal beyond what would be predicted by classical information theory. These aspects are important to distinguish. Foremost of these aspects is the "offline" processing of stored information. Storage occurs as analog-to-digital conversion is performed resulting in a series of digital representations of the received data.

Subsequent processing is achieved using modern integrated circuits in an "offline" way that does not adversely affect the bandwidth of the system. Offline processing results in a tolerable transport time delay and as a consequence of the delay, "near real-time" performance results. It is this aspect that presents fundamental opportunities over what can be accomplished in conventional real-time processing. Departure from real-time accounts for a potential to obtain signal-to-noise improvement substantially beyond that achieved by merely averaging noise samples and applying the average to a matched filter. If one were to attempt to attribute the improvement over simple summing, it would lie in the improvement of the entropy of the overall process. The present invention has brought a degree of "order" not previously present.

The order achieved by the present invention is the result of iteratively forcing each and every sample of the noise to change polarity in a carefully defined manner, which is one of the primary aspects of the present invention. The ability to reduce "thermal-noise" affects, inherent in any receiving system, to a level below that which can be achieved by the averaging of several trials is unique. This achievement is facilitated by the "digital" nature of the process. However, the "digital" nature itself does not produce the achievement. Rather, it is the subsequent use of the digital data in the special iterative process that accomplishes the goal.

The invention, basically, consists of an improvement to the entropy of a sequence of events that have previously occurred and have been stored.

THEORY OF OPERATION

The theory of how the "matrix" configuration and its related "iterative process" can determine the "noise value" of each and every trial will be described after a brief introduction about he characteristics of the overall method.

The conceptual basis of the overall method is an example of the use of numerical logic, (in addition to simple relationship equations) to quantify functions. Such a method is based on examinations in terms of confirmations and contradictions that result from numerical actions. The reduction-to-practice of such a method lends itself to the use of multiple integrated "circuits on a chip" that consists of additions and subtractions. Each step provides a known, yet different numerical impact. The resulting range of consequences is explored by a closed loop iterative processor, which is used to obtain a noise estimate of each sample from each trial. The sensing for such feedback loops requires two inputs name by the average and the input nearest to the average. The sense consequences in near-real time provides the means for overcoming the conventional perceived notion that reduction of noise cannot be extended beyond that which is achieved by simply averaging trials. With the approach, to be described, the noise contribution from each trial can be reduced to values arbitrarily close to zero.

Figure 2:
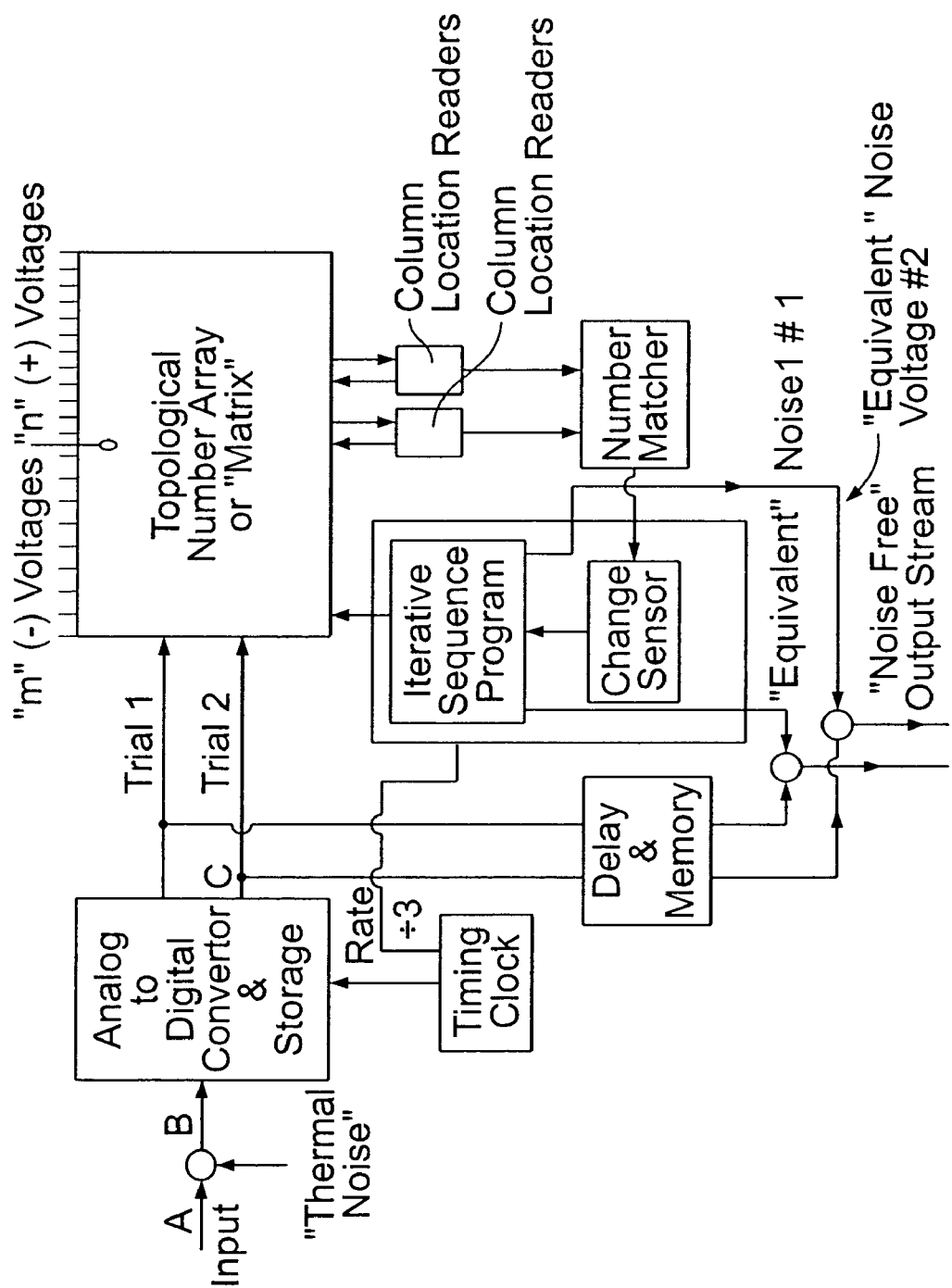
FIG. 2 illustrates an overall signal enhancing system configuration of the system in accordance with a preferred embodiment of the present invention. This block diagram shows an iterative processing scheme including a Topographical Number Array, which is transformed into a Topographical Change Sensor (TCS) in accordance with an embodiment of the invention.

The block diagram of FIG. 2 will further explain these operations and resulting consequences.

If the input signal (plus noise) is in analog form, an analog-to-digital converter produces a digital representation at an appropriate rate to accommodate signal modulation. The rate is controlled by a local timing clock that samples the incoming signal plus associated "thermal" noise that results primarily form the signal amplification. Each such digital signal or "trial" is injected with i.e. added to, many different predetermined digital values that differ from each other by small increments that are contiguous and encompass virtually the entire minus (m) and plus (n) value range that is probable. These successive and contiguous sums can be considered as (m +n) columns of a matrix with successive trials forming the different rows.

Typically, two successive trials and the average of these trials form a "two by (n+m)+1) matrix". Here "n" represents the number of columns injected with minus values, while "n" is the number injected with plus values and the "1" represents the column of zero injection. Typically n+m+1 might be about 41, or more, to yield a 2×41 matrix. A "third" row might be used under some circumstances, as well.

As a result of the above process the noise component of each signal plus noise sample for each trial will transition from plus-to-minus or minus-to-plus and therefore go "through zero" in a unique column. This is illustrated by FIGS. 4A and 4B. These figures show both the "m" values FIG. 4A and the "n" values FIG. 4B. The first column of FIG. 4B is the "middle/center" column of a combined left and right FIG. 4A. The information is shown separately in a right portion, FIG. 4A, and left portion, FIG. 4B, simply to enhance the readability of the entrees. The "zero" or "near-zero" values are circled. Sometimes two adjacent plus and minus columns encompass the zero value and in this case both columns are circled. It must be remembered that FIGS. 4A and 4B are not available in a noise only form and the matrix is constructed by the use of the noise samples in the simulation. They are used here simply to provide an illustration of why the numerical number matrix works. It should be apparent that when the signal-plus-noise is included, as in the entries shown in FIG. 6, the places where the noise passes through zero will make the entry at these corresponding places, at the "average" and for each of the trials, consist of the signal value, although the identity of such columns are not known until after the iterative process is performed.

The next functional task is to identify for each trial and the average row of the matrix pertinent columns that will become involved in an "iterative" process of several iterations or steps. Each such iteration is a "closed loop process" in which the matrix becomes a "change sensor". Also as part of this process a series of iterative probes each of known magnitude and "polarity" are used to control the next step of the processing using consequences from the previous step.

The matrix which can be considered a "topological number array" is shown in FIG. 6 and is transformed into a "change sensor" (or detector) by placing the column entries of the two (or more) rows into equilibrium about the zero column which is the topocentric point of the of number array (or matrix). This is accomplished by determining the deviation between the average and the two individual trials. This scalar quantity is independent of the signal and is simply the signal plus noise of each trial minus the signal plus noise average. This can be designated as IA (or QA) where the A indicates that it contains no signal because the signal cancels in the digital plus noise minus the digital plus average noise calculation. IA is simply the deviation value and is known, for the two trial cases the value is plus and minus equal magnitudes. For the "other than average row" this amount of deviation is translated into an equivalent column shift which is simply the magnitude divided by the column spacing to yield an approximate number of column displacements with the polarity of the deviation determining whether the column shift is to the left or to the right.

The preceding measures have partially endowed the topological number array with sensor capabilities; it is necessary in order to complete the task to provide an "error sense" to its ability to make discrete (i.e. "sharp") comparisons. Such needed capability is provided by reversing the plus-to-minus formatting of the numbers in one of the rows; the "average" row is selected for this role. Thus instead of preprogramming the contiguous injection number from minus to plus those values are injected in a plus-to-minus fashion, i.e., in reverse order. This provides a bipolar detection or sensing capability.

This is a qualified change detector to accommodate each iterative probe. The necessary response, however, requires the logic provided by the FIG. 8 so that the appropriate iterative steps are used in the process shown in FIG. 9 (and 10) which provide the desired noise estimate for each overall trial when added algebraically.

The iterative process is performed at a slower rate than that for the A/D sampling rate. This is accomplished by using a sub-multiple of the basic clock rate and is shown in FIG. 2 as the "divide by 3". (This number can be selected as appropriate for each application.) The slower rate requires the storage of the basic samples (the information in the iterative matrix is inherently stored by its nature.) The iterative process can be conducted at a slower rate because the off-line nature of its implementation does not affect the bandwidth handling capability of the system.

Each noise estimate can be cancelled from the signal-plus-noise value of each trial as shown in FIG. 2. This cancellation involves the delay (and storage) of the signal-plus-noise as shown in FIG. 2 so that noise estimates from like trials can be correlated.

DETAILED DESCRIPTION OF OPERATION

Figure 3A:
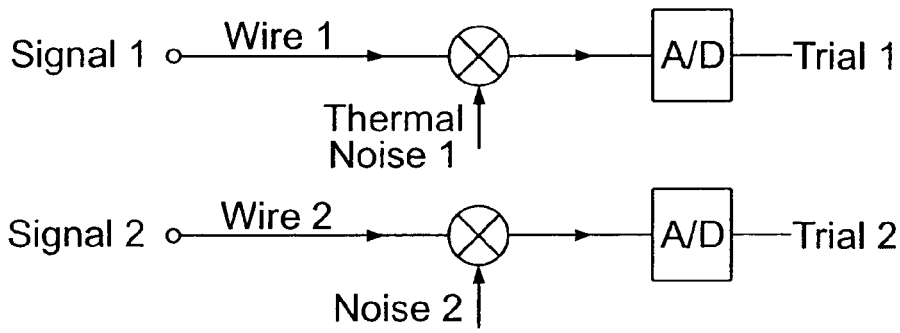
FIGS. 3A, 3B and 3C illustrate various means of connecting to the signal as provided by the transfer network shown in FIGS. 1A, 1B and 1C.
Figure 3B:
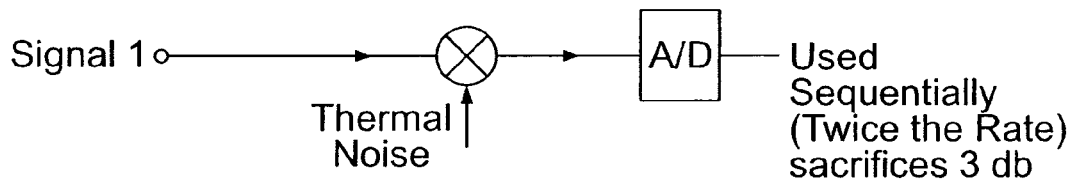
Figure 3C:
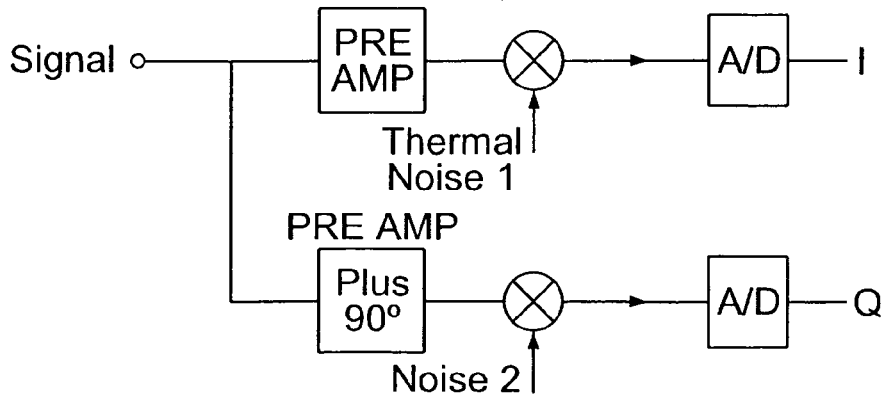

Various methods of connecting to the "wirelines" are illustrated by FIGS. 3A, 3B and 3C. The most straightforward to understand is shown in (a) which is simply the use of two wires to obtain two inputs with the "same signal" (with different noise values introduced at each input). This constitutes two trials with like signals and different noise. As such other amplification and analog to digital conversion results in two signal plus noise column sequences that can be used as two rows of a topological number array or matrix. The process as described previously is applied and will be described in more detail by reference to FIGS. 8 and 9, as follows.

Since this type of connection uses twice as many wire connections, the channel capacity of the network is reduced by a factor of two. Also there is no assurance that the two "signals" will be equal as assumed for illustration. Thus this method is used only to illustrate the "two wire" method; and the other options are resorted to.

The first alternative is to use a single connection and receive two (or more) signal plus noise samples in sequence. This necessitates doubling the sampling rate with a resulting penalty. However, the processing methods remain the same with the two signal-plus-noise samples being used sequentially. This calls for a sampling rate twice as fast as the optimum Nyquist criteria for a modulated signal and results in a sacrifice of 3 dB. However, the tradeoff for near complete cancellation of noise for each successive pair of samples (trials) is significant particularly when considering that the higher noise values are identified and virtually eliminated. This small sacrifice for a potential improvement of 30 dB, or more, net improvement is a worthwhile tradeoff.

A more optimum approach, illustrated in FIG. 3C, involves the use of in-phase and quadrature components as the two signal-plus-noise samples used for forming the topological number array or matrix. This involves sampling the signal (plus-noise) at two phases separated a net of 90 degrees apart; this can be accomplished by a 90°-phase shifter (or an equivalent plus 45 and minus 45 phase shift in the two lines). A more elegant mechanization is to perform this shift as part of the analog-to-digital process by sampling the analog-to-digital converter of the two signals the equivalent to 90 degrees apart. The mechanization is similar but this approach requires processing both the "In phase and quadrature channels separately. Also the subtraction of the estimated signal from the actual signal is a vector subtraction that takes place at a 45 degree reference.

As mentioned previously as part of the Theory of Operation the first numerical action consists of deliberately changing the polarity of the noise portion of the signal-plus-noise voltage of each and every trial. This forced change is accomplished by providing a series of contiguous voltage increments that span a range of about minus one volt (−1.0) to plus one volt (+1.0) in increments on the order of 0.05 volts or less, thereby forcing the change of polarity to occur in one column, or an adjacent pair of columns. There is much flexibility in the number of voltage increments and the "graduation" of their spacing. As each "trial" of signal plus noise is entered into this series of columns, a network of trials, or matrix, is formed which is referred to as a topographical number array or matrix. The addition of the value inserted into each column creates a "new noise" for each column. As a consequence of these additions, there results one column in which the net polarity of the noise-only portion changes (because the voltage in that column is opposite to that of the noise). While this is focused usually in a specific column, this condition can occur between adjacent columns giving rise to interpolation between adjacent columns.

A series of trials, each consisting of independent samples of signal-to-noise was used in simulation. It corresponds to each digital value obtained from the A/D converter each time it is sampled by the A/D clock. This rate is appropriately chosen to accommodate the modulation and its characteristics (particularly "bandwidth") of the information to be received.

The "noise model" used for the simulation of the "stream" of signal-to-noise trials is based on generally accepted Gaussian type of probability density distributions as used on radar and communications receiving systems. While such distribution is significant in analytical treatments, the non-real time methods used here are less susceptible to the noise model. This is because each unwanted noise sample is literally forced to a value that goes through zero at each point of inflexion. This is controlled by its relative positioning in the "topographic array".

As a result of the above steps, each trial has a unique column whose relative location in the network corresponds to the magnitude of the noise portion of that trial and whose + or − polarity location is opposite that of the actual noise polarity. Thus, the "noise entry" in the matrix will transition through zero in such a correlated column.

To illustrate this, FIGS. 4A and 4B was constructed using the simulated values of the noise. (These are not available in practice but serve here merely to illustrate the nature and effectiveness of the array of columns to accurately "locate" the noise within the topographical matrix.)

Figure 5A:
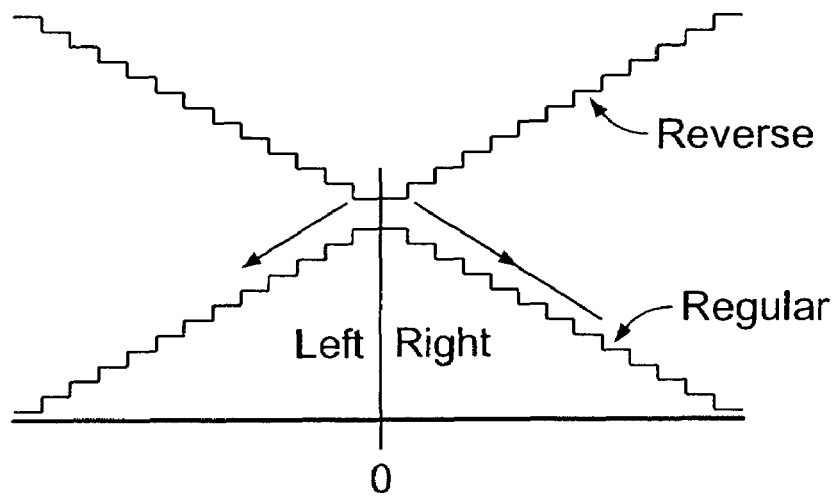
FIGS. 5A and 5B illustrate a method of inputting preprogrammed voltages in "Regular" and "Reverse" manners in accordance with the present invention.
Figure 5B:
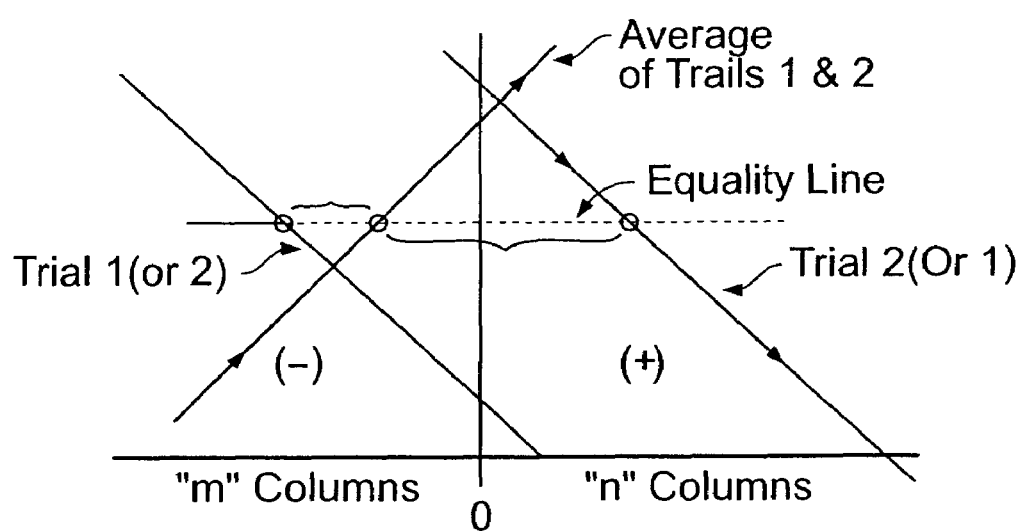

To extract the information (as to column choice) it is important that part of the information is introduced or "scanned" into the iterative matrix in a special way that will produce a "proper error sense" when making voltage comparison between entries from two appropriate columns. The pertinent columns are either of the first or second trials and the average of these two trials. To accomplish this, the "average row" is scanned (i.e., the voltages introduced) in a minus to plus manner, which is the opposite of that used in trial 1 and trial 2, as shown in FIG. 5A. This insures that the error sense at the different "zero noise transition points" are opposite rather than "parallel", i.e., having like slopes as illustrated in FIG. 5B. The appropriate "zero noise comparisons" are made between each trial and the average. Such comparisons can locate the column location to a high degree of sharpness or precession using interpolations of the values from adjacent columns.

The deviations from the average are used because of two or more trials, i.e., samples of signal plus noise are averaged, then the algebraic sum of the two or more deviations from the average is zero. This concept is one of the foundations of making the process independent of signal level, i.e., the deviation from the average contains no signal and is expressed as 1A or QA. (The "deviation from Average" is simply equal to the actual I (or Q) minus the average I (or Q) of the two (or more) of trials.) Since both I and I average contain the signal, the subtraction of the average I from the actual I cancels the signal.

The topological number array is rendered a change detector by applying a column shift process in which this shift is equal in amount to the magnitude of the deviation and the shift direction, i.e., left or right, is determined by the polarity of the deviation. The amount of shift is the deviation amplitude divided by the column spacing increments to express the result in number of columns. This amount of shifts is made in the "deviation from average row" and places the two rows (the deviation from average row and the average row) in equilibrium about the zero column, which is the topographic column. An equilibrium condition, such as shown in FIG. 6, qualifies the matrix as a change detector because any further disturbances in either row introduced by an iterative probe will create a mismatch of column readings and lead to a new location for the match of the column entries; such a new match will occur in either the left or right portion of the topological array.

Figure 8:
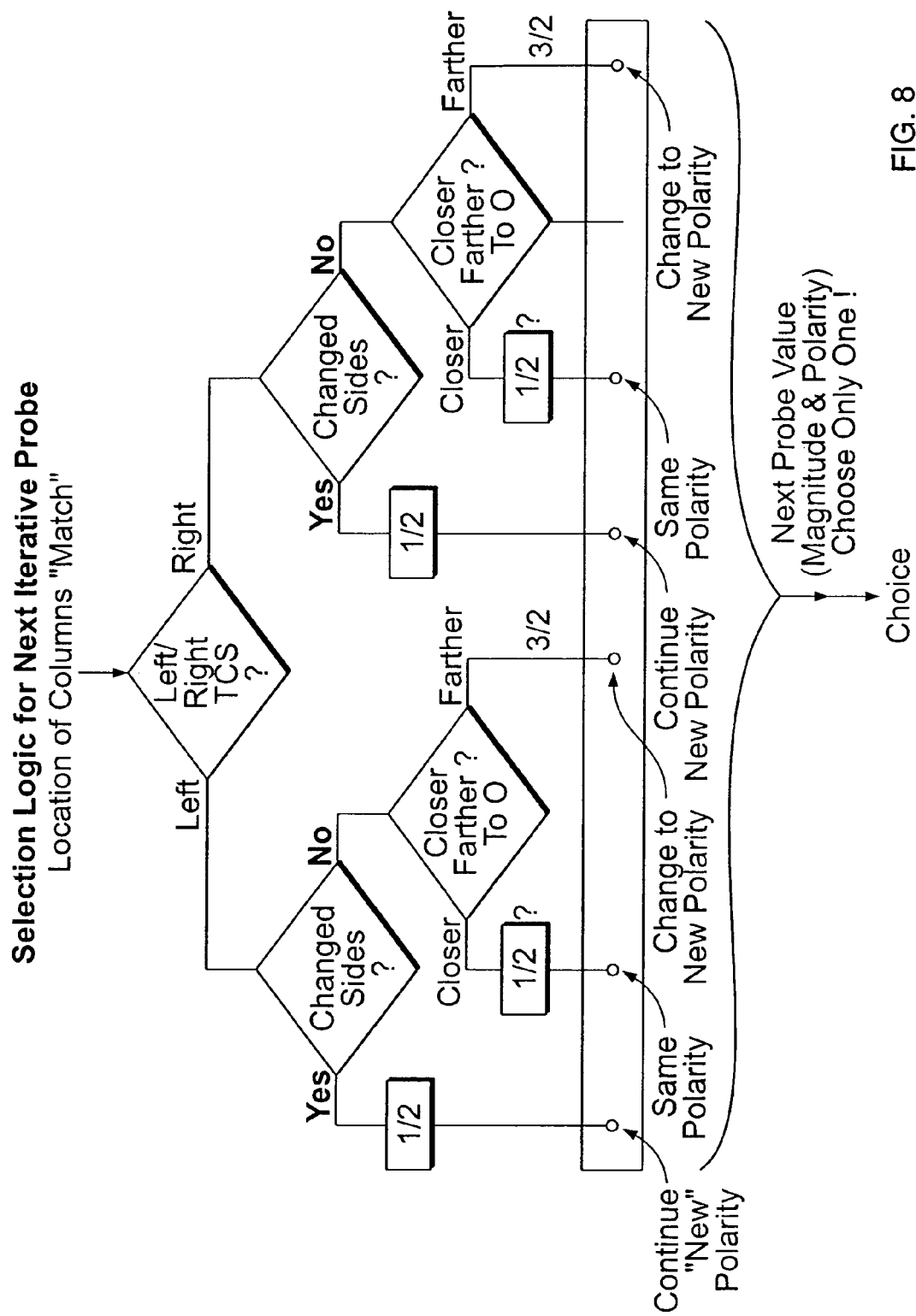
FIG. 8 is a logic tree that illustrates how the results from FIG. 7 are utilized to select a next iterative probe value.
Figure 9:
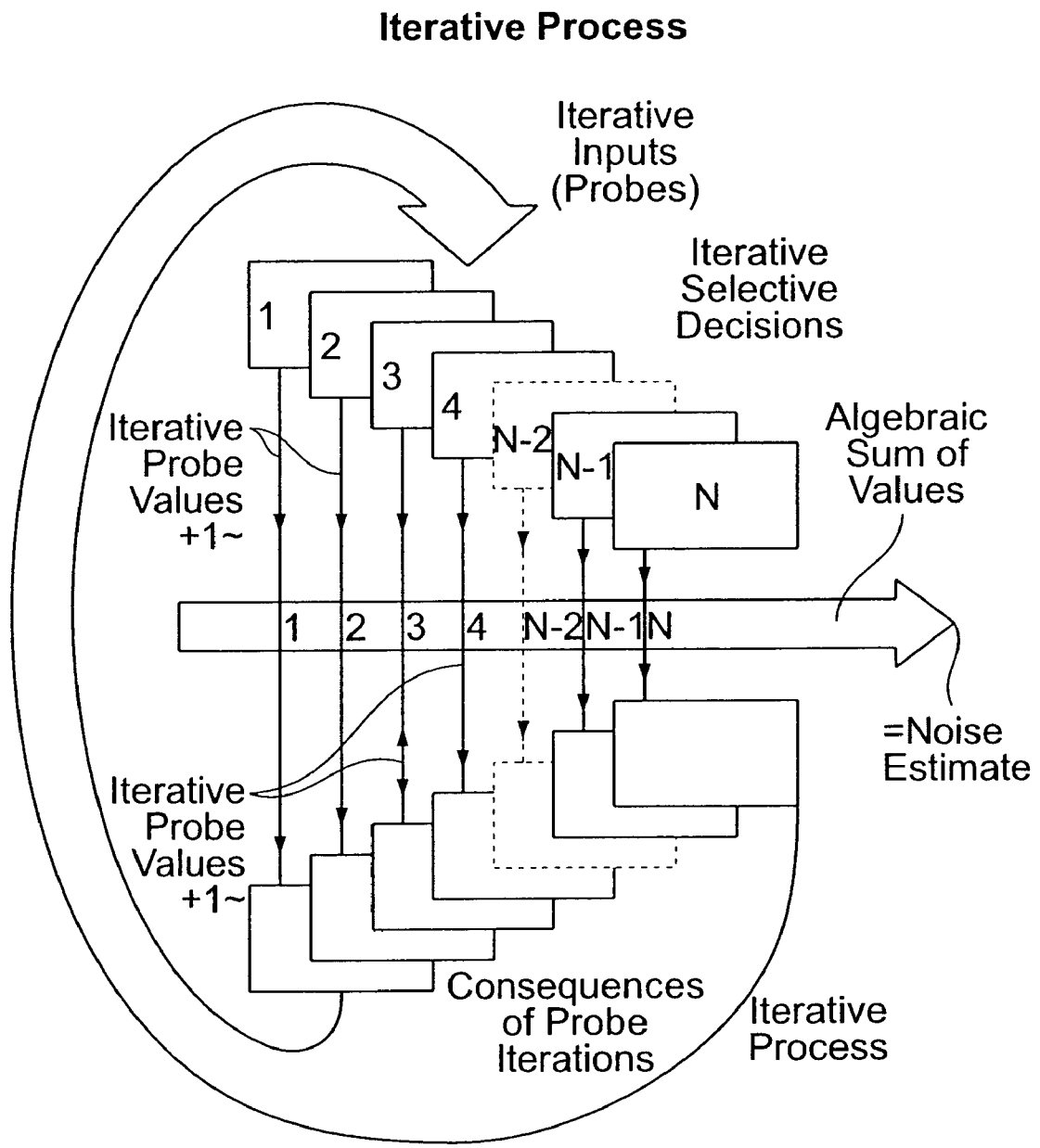
FIG. 9 is a flow diagram that shows how the results from FIG. 8 are used to control the iterative process so as to make it converge and provide a very accurate estimate of the noise for each trial.

A flow diagram is shown by FIGS. 8 and 9 consisting of the logical selection for each iterative probe, FIG. 8, and the control of the iterative steps, FIG. 9.

Figure 7:
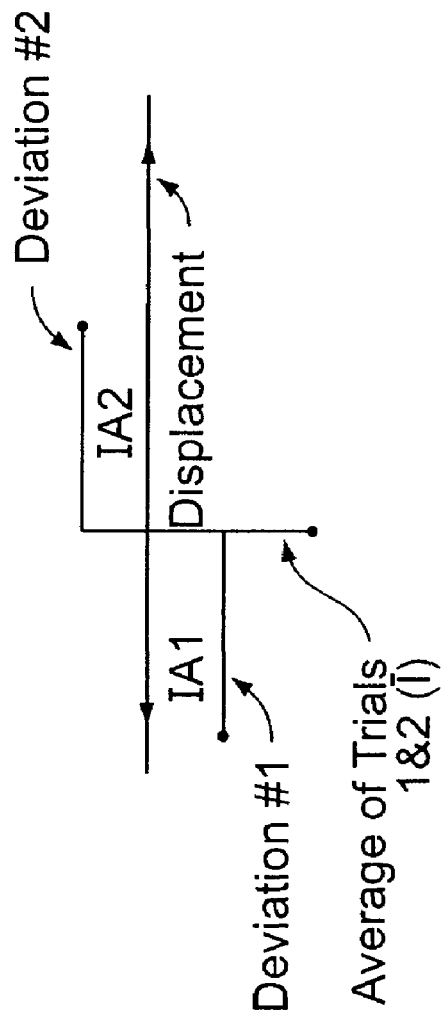
FIG. 7 is a Table of Initial conditions and instructions that help establish the initial or "zero iteration" used in the process described by the Figures that follow.

Starting with the condition given in FIG. 7 which contains the instructions for obtaining the initial column match, the consequences of such a match are determined by the decision logic in FIG. 8. The first determination is whether the "new" match (caused by the initial iterative probe) occurs in the left or in the right portion of the topographical number array sensor. The next question resolved is whether or not this situation represents a change in side with respect to its initial location (i.e. from left to right or vice versa). A "yes" in either indicates that a change in polarity has occurred indicating the use of the new polarity for the next iteration. In recognition that the first iteration was sufficient to cause such a significant change, the next probe should be of a smaller amount and the diagram shows the former value is halved to cause the match from the next probe to occur closer to zero.

The absence of a change of polarity (i.e. same side location) indicates that a probe of the same polarity as the previous one should be continued for the next probe. However, it is a now desired to know whether the prior probe caused the resulting column match to occur closer to, or farther from zero. The closer the match is to zero is an indication that the process is converging and a smaller value (such as one half) should be a good choice unless it causes "overshoot" (i.e. change of polarity on the next iterative probe). However, if this probe is not halved and a large amount of noise is present, the process should converge faster, until the polarity changes; if it is found that more than 2 iterations result in continued maintenance of the same polarity; if this occurred the 3rd and or 4th iteration will benefit by not continuing to halve of the magnitude of the next probe. This will occur until a polarity change is noted. Such downstream iterations are shown in FIG. 10 which is referred to as "augmented logic" reflecting iteration history.

If the consequences of the process makes the match farther from zero, a divergence is indicated which calls for the next probe value to be of opposite polarity and greater than 1 to make up for the loss of convergence during this probe. A nominal value such as 1.5× for the next iteration is shown on the diagram of FIG. 8.

Using such logic, the choice of one of six different options available is indicated in the form of an appropriate magnitude and polarity for the next probe.

Figure 10:
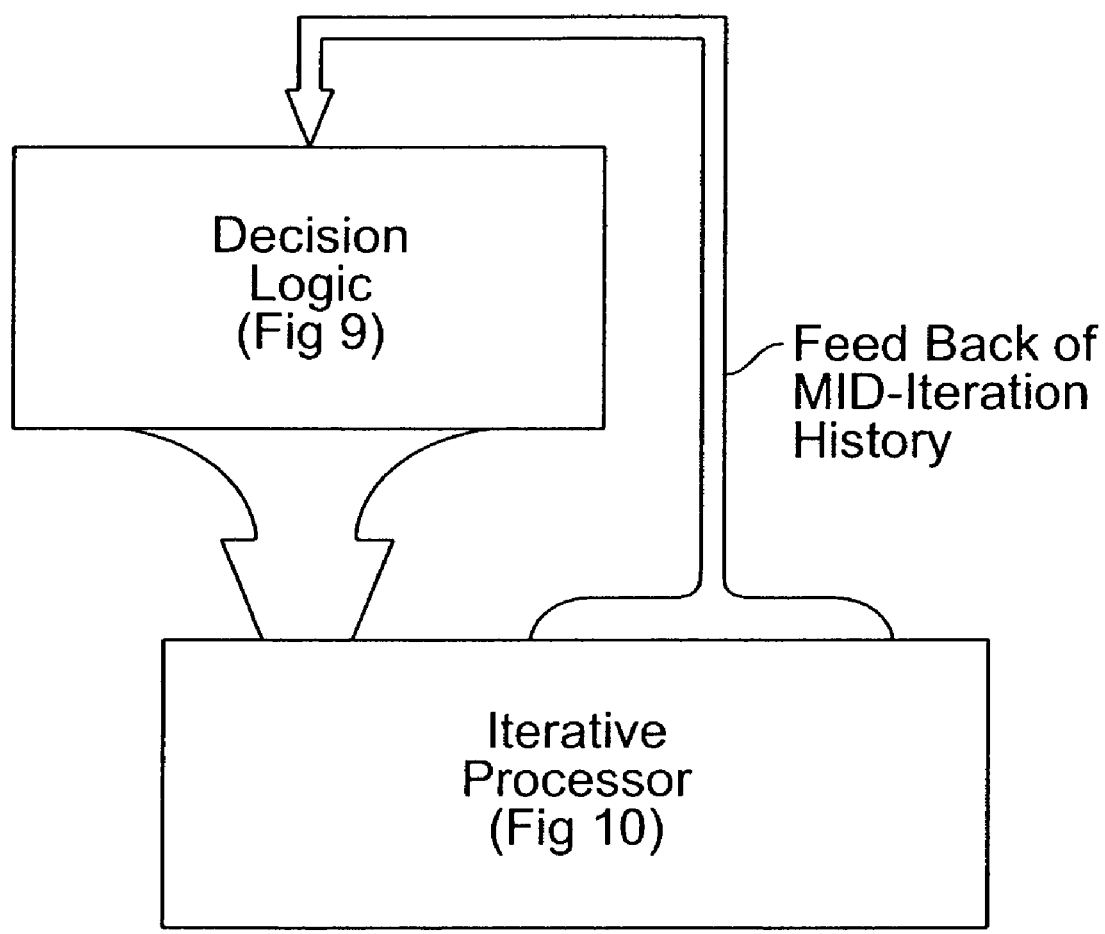
FIG. 10 illustrates how additional "augmented" logic is coupled to FIG. 8 using information from the history of two or more results from later iterations.

It should be perceived that the selections of a series of appropriate probes as illustrated in FIG. 8 through FIG. 10 are representative of the process that determines the "speed" of convergence to use a smaller number of iterations to cope with the larger value of noise the magnitude selections process might eliminate the ½ where a question mark is shown.

FIG. 12 shows a computer printout of typical results of the process illustrated by FIGS. 8 and 9 using appropriate iterative programming to achieve the results shown. These represent the results for each trial of converging results show by the middle (and next to last column), of the noise values after each of six iterative steps. The "original" average noise for each trial is shown in the first column after the trial number, for 36 independent trials (3 per entry number) for I's, (not shown) and Q's, (FIG. 12). (The I and Q results have been processed independently).

The key results are shown in the "Equivalent voltage added" column which is the algebraic sum of all the plus and minus voltage probes all of the iterations and represent the "output" as shown previously in FIG. 9. This column provides the sought-after estimate of the magnitude of the noise, note that these values closely approximate the magnitude of the actual noise show in the first column. The polarity of this magnitude will be opposite as shown clearly in the printout. The ratios of these estimated magnitude values to the original are shown in the last column. These vary widely although the estimate values as very close to the actual as expressed by the residual noise in the nest to the last column. The ratio column is in terms of voltage comparison so that a ratio of 10 corresponds to a "20 dB" improvement.

The noise residuals are generally within ±0.02 volts. This value is determined for the most part by the number of iteration and will diminish to a value ultimately determined by the accuracy of the digital measuring ability of the process. Which will depend on how well the embodiment is executed.

The ratio must be interpreted carefully because frequently the lower ratio corrupted to nose that is already low relative to the "norm". Taking this into account perusal of the result indication an integrated improvement of about 30 dB; with one or two more iteration this improvement would improve by 6 or 8 dB.

USE OF INTEGRATED CIRCUITS

The operations previously described can be implemented by means of integrated circuit "chips"; such a semi-conductor integrated circuit first provides the means for injecting a series of predetermined digital values furnished by, for example, preprogrammed Electrically Programmed Read Only Memory (EPROM) that also memorize the resulting "new" digital values. The result is a stored topographical number matrix of two rows which can serve as a means of sensing changes in each step of an iterative process or 4 or more steps. Each step includes an iterative probe, which cause a column displacement that is determined by its magnitude and polarity. The information in two appropriate columns is compared by a digital number compared to obtain a match when these entries are approximately equal. This is in accordance with FIG. 2.

As a result of the location of this match the next iterative value prove is determined by using the logic shown in FIG. 8. Such a new probe value consists of its magnitudes and polarity. This process is repeated for each of the several iterations and the algebraic summation of the probe values the "chips: with an accurate estimate of the noise portion in the form of a magnitude and a polarity (the latter is opposite to that of the noise.) This permits a nearly complete noise cancellation from the stored (and delayed original signal plus noise sample for each trial. As a result of the iterative converging process on the chip each trial provides a "frame of enhanced signal information." A series of such trials or samples accommodate the modulations of the signal to provide a stream of modulated signals.

It should be noted that in the above process key information form the decision tree of FIG. 8 is given as to whether, after each iterative probe the column match occurs either closer to or further from the center column.

Each iteration starts with the conditions from the end of the previous one and each series provides a frame of information to accommodate signal modulation. Several chips (or subsection of one chip) can be used in a form of parallel processing of different complete iterative frames. One or more such frame can be separately and simultaneously formed and stored to increase the speed of processing of each frame.

For each entry, the column choice is employed to carry out the process to obtain the estimate for each trial. The value readout can be determined more accurately by interpolation between adjacent column. This process can provide a precision of determination of about 0.01 volts as determined digitally by the column readings described next. A voltage of such precision is subtracted algebraically from each noise sample in an ongoing manner to provide a continuous stream of information form which the noise has been dramatically reduced.

The "Column readers" shown in FIG. 2 provide two different types of information. The first is used to help locate the relative positions of the columns that contain the pertinent information. This requires a "match" of the readings between two entries in these two columns. The second is the value of the column value calibration as determined by its location.

The ability to sense a smaller value can be enhanced if the signal plus noise "voltage" range is increased, by amplification to ±3 or ±5 volts. This is in terms of digital values. To this end, the same "±1 volt chip" can be time shared 3 or 5 times to provide segmented coverage of the total range of appropriate sequential bias values for each replication. This approach of course, when performed "offline", will increase the time delay imposed by the processing and thereby influence the "speed" requirement of the processing chips. Storage capacity is provided to accomplish the expanded iterative network (or matrix) coverage so as to permit the access to be performed.

INTERNET SYSTEM CONFIGURATION

FIG. 1A shows a simplified but comprehensive representation of the overall scheme used to provide a communication system suitable for the Internet. The key elements shown in addition to "the sender" and the "receivers" (by stations or by individual users) are 1) the "Service Provider" facilities, 2) an overall network for "Switching and Routing," and 3) Localized Distribution means.

The key functioning elements in this overall network are the "gateways" at the entrance of the Service Provider and the gateways of the Localized Distribution System to which the message (coded as to distribution) is routed; the gateway of the ultimate user is the remaining link of the process. Shown are the means of using analog information at the gateways and eventually using the received information at the user also in analog form. This is the result of using messages historically at audio frequencies (sometimes involving a "carrier" as well).

These capabilities will need to go beyond historical practice when the information is expanded to include data used for business and special function beyond "voice" and with an even greater demand when video frequencies are accommodated.

Figure 1B:
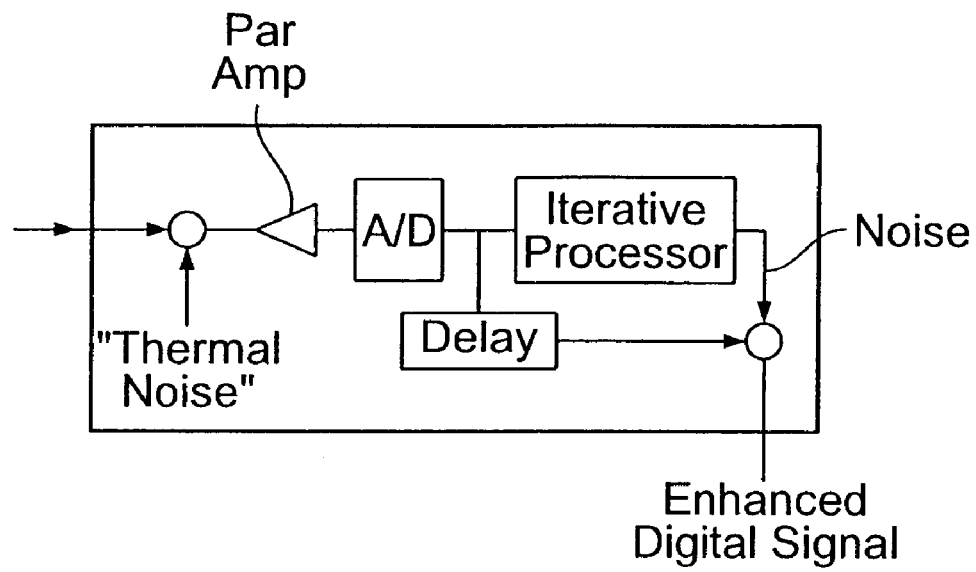

FIG. 1B illustrates an embodiment of the invention at a gateway receiving the signal in analog forms (at audio or video frequencies). Sometimes a carrier frequency is used, which is modulated in various ways by such frequencies. FIG. 1B represents the invention in its more basic form.

Figure 1C:
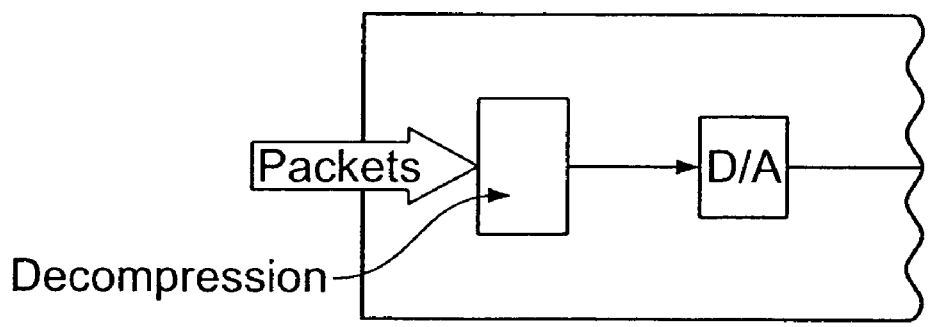

FIG. 1C illustrates an embodiment for which a auxiliary step is required which can be provided, for example, by a modem, when receiving a signal in digital form and which can occur in digital packets of information which have been "compressed" as part of the bandwidth accommodation characteristics of the network. In such an instance a decompression means is used before a digital to analog conversion.

FIG. 1B is referred to for simplicity of explanation, as an "A/D gateway" while FIG. 1C is called a "D/A gateway".

The roles and function of the invention can be explained in such use by reference to the overall system scheme illustrated as FIG. 1C; accordingly.

The Service Provider receivers the many separate signals from many senders with such signal being accommodated by gateways which in the instance should employ the embodiment of the invention shown in FIG. 1B to provide an enhanced signal in digital form as shown in the diagram. This implementation is a simplified block diagram of the more comprehensive block diagram of FIG. 2 that has been explained previously.

The total process including the iterative probing, sensing and decision making using feedback method for several iterations or steps and these are referred to as the one-block "Iterative Processor". Such a processor provides an accurate noise estimate for each trial and this is "subtracted" from each signal-plus-noise sample to remove most of the actual noise; this step requires an appropriate (fixed) time delay to correlate or align, corresponding samples. As explained throughout this specification the processing occurs in "near real-time" to provide the opportunity for the signal-to-noise enhancement. Such enhancement takes place between points A & B so that an enhanced signal is furnished to the "Multiplexing" and Assignment shown within the Service Provider block. The multiplexing permits more that one "message" to be carried on a single line, which can be a wire or fiber optic strand.

At point B this enhancement of relative signal strengths could be 30 dB or more relative to the noise that would be present without this embodiment and such an improvement can be used, in part to provide more effective multiplexing to achieve greater channel density. An alternative to using all, or part of the "30 dB" improvement would be the ability to accept weaker signals so that signals from a farther distance away could be accommodated. A typical allocation might be 10 dB for longer "range" and 20 dB for more channel capacity for the same basis of the Service Provided signal to the switching and routing network. Such a signal might be provided in "packets" of digital information that have undergone compression of modulated information. This process occurs after the enhancement and the primary role of FIG. 1B is to provide a stronger signal.

The switching and routing network has a wide range of technology using wire and fiber optics in accordance with an "internet protocol" that sends the signals to the Localized Distribution System. The gateway at the Localized Distribution System would use the embodiment of the invention as augmented by the addition as shown in FIG. 1C; here the signal received as a result of routing consisting of compressed packets that require decompression before the digital to analog conversion. Because of the enhancement potential of the invention a smaller signal can be accepted here, relative to noise. For a given acceptable digital error rate a strong analog signal is delivered to the Multiplexing portion of the Distribution system. This improvement can enable such multiplexing to accommodate more channels (i.e. increased channel capacity) here as well as in previous multiplexing.

Such a signal is delivered to the final gateway at the receiver of the user; here the version of FIG. 1B is used again. The enhancement now permits a weaker receive signal (relative to noise) to be received. Those enhancements can be used to extend the range to the user as well as help accommodate the addition channel provided at the distribution system by the enhancement of gateway #2 (FIG. 1C). The enhanced signal resulting from gateway 3 can be used to provide a stronger signal that will facilitate realization of a shorter time to acquire (i.e. access) the Internet connection and help the "last mile" of the reception link.

What is claimed is:

1. An integrated circuit device or group of devices comprising:

a receive portion operable to receive signals from a wireline;

an amplifying portion operable to amplify the receive signals to form amplified signal-plus-noise signals;

an I-Q portion operable to create in-phase and quadrature digital versions of said receive signals, wherein the in-phase and quadrature versions are about ninety degrees out of phase with respect to each other;

a memory portion operable to store the signal-plus-noise signals;

a matrix forming portion operable to form at least one matrix digitally representing a plurality of values, the values consisting of the in-phase and quadrature versions of the receive signals;

an iterative processing portion operable to performing an iterative process on data contained in the matrix to determine an estimate of the magnitude and polarity of a noise portion of the signal-plus-noise for each of one or more trials; and an operation portion operable to subtract each estimated noise value from the stored signal-plus-noise version to obtain a noise-reduced signal, wherein a topographic digital number array, which covers a positive and negative range of numbers and is in equilibrium about a topocentric value, is used to detect when the polarity of the noise portion of a signal-to-noise combination changes from positive to negative or from negative to positive in response to an injection of a predetermined value probe.

2. An integrated circuit chip as claimed in claim 1 that executes a logic flow guided by means of a decision tree and thus, in an orderly fashion, reduces several possible consequences to a single choice of one value for a subsequent iterative probe, such choice consisting of an appropriate magnitude and polarity.

3. An integrated circuit device or group of devices as claimed in claim 1, wherein computed deviations form array values, which are signal level independent, are applied to one row of the matrix in a form of a plus or minus column shift results in the matrix being in equilibrium about the topocentric of the array and the matrix is operable to serve as a change detector to sense progressive changes as caused by a series of iterative probes.

4. A method for increasing the signal to noise ratio of a receive wireline system, said method comprising the steps of:
receiving receive signals from a wire-line;
amplifying said receive signals to form amplified signal-plus-noise signals;
creating in-phase and quadrature digital versions of said received signals wherein said in-phase and quadrature versions are about ninety degrees out of phase with respect to each other;
storing said signal-plus-noise signals in a memory device;
forming at least one matrix digitally representing a plurality of values, said values consisting of said in-phase and quadrature versions of said receive signals;
performing an iterative process on data contained in said matrix to determine an estimate of the magnitude and polarity of the noise portion of the signal-plus-noise for each trial;
subtracting each estimated noise value from the stored signal-plus-noise version to obtain a noise-reduced signal; and
using a topographic digital number array, that covers a positive and negative range and is in equilibrium about a topocentric value, to detect when the polarity of the noise portion of a signal-to-noise combination changes from positive to negative or from negative to positive in response to an injection of a predetermined value probe;
in which computed deviations form array values, which are signal level independent, are applied to one row of said matrix in the form of a plus or minus column shift results in the matrix being in equilibrium about the topocentric of the array and thereby enduring the matrix with the ability to serve as a change detector to sense progressive changes as caused by a series of iterative probes.

* * * * *